United States Patent
Robinson et al.

[11] Patent Number: 6,152,764
[45] Date of Patent: Nov. 28, 2000

[54] JAW BLADES FOR WATTHOUR METER SOCKET ADAPTER

[75] Inventors: Darrell Robinson, Highland Township; Allen V. Pruehs, Howell; Karl R. Loehr, Novi, all of Mich.

[73] Assignee: Ekstrom Industries, Inc., Farmington Hills, Mich.

[21] Appl. No.: 09/148,253

[22] Filed: Sep. 4, 1998

Related U.S. Application Data

[60] Provisional application No. 60/057,537, Sep. 4, 1997, and provisional application No. 60/064,355, Oct. 30, 1997.

[51] Int. Cl.$^7$ ................................................. H01R 33/945
[52] U.S. Cl. .......................... 439/517; 361/666; 439/508
[58] Field of Search ................................. 439/517, 508, 439/146, 167, 747, 861, 856; 361/659, 664, 665, 666, 667

[56] References Cited

U.S. PATENT DOCUMENTS

| | | | |
|---|---|---|---|
| Re. 34,531 | 2/1994 | Bell et al. | 439/135 |
| 1,645,539 | 10/1927 | Mau | 439/866 |
| 2,030,522 | 2/1936 | Johansson | 439/508 |
| 2,468,368 | 4/1949 | Jackson | 439/747 |
| 2,911,616 | 3/1959 | Townsend | 439/866 |
| 3,031,640 | 4/1962 | McKee | 439/745 |
| 3,050,706 | 4/1962 | Kitscha | 439/907 |
| 3,061,763 | 10/1962 | Ekstrom | 361/666 |
| 3,066,204 | 11/1962 | Mobarry | 439/907 |
| 3,142,891 | 8/1964 | Travis | 439/856 |
| 3,221,216 | 11/1965 | Kobryner | 361/704 |
| 3,596,234 | 7/1971 | Supienza | 439/682 |
| 3,643,209 | 2/1972 | Coston | 439/517 |
| 3,657,683 | 4/1972 | Grieshaber | 439/781 |
| 4,127,924 | 12/1978 | Ross | 29/413 |
| 4,184,735 | 1/1980 | Ammon et al. | 439/747 |
| 4,213,669 | 7/1980 | Wittes | 439/611 |

(List continued on next page.)

FOREIGN PATENT DOCUMENTS 0340951  4/1989  European Pat. Off. .

OTHER PUBLICATIONS

Grote & Hartman Product Catalog, 1993.
Long Life for Power Contacts, Machine Design, Jan. 11, 1990.
Series Reconnect Device Series SRD–51900, Scientific Atlanta Instrucmentation Group, 1992.

*Primary Examiner*—T. C. Patel
*Attorney, Agent, or Firm*—Young & Basile, PC

[57] ABSTRACT

A watthour meter socket adapter has a housing formed of a base and unitary annular sidewall projecting from the base. Jaw blades are mounted in apertures in the base. In one embodiment, a spring clip is movably disposable in an aperture formed in each jaw blade to define a meter blade terminal receiving slot therebetween. In another embodiment, the spring clip is fixed to the jaw blade by a single mechanical fastener. Complimentary locator members are formed on the jaw portion and the spring clip for non-movably locating the spring clip relative to the jaw blade. A tab projects from the jaw blade for non-movably fixing the jaw blade relative to the base of the socket adapter. Flanges formed on the base fixedly engage the tab. The jaw blade may be formed of a single unitary jaw contact and blade terminal or a discrete jaw member and blade member. U-shaped support members are formed on the base for engaging opposite side edges of the blade members for non-movably fixing the blade terminal relative to the base. Projections are disposed in the base aperture and engagable with the blade members for non-movably supporting the blade member relative to the base. A unitary jaw blade and spring clip is formed of first and second arms unitarily projecting from opposite sides of the jaw portion and having outer end spaced from the jaw portion to define a blade terminal receiving slot with the jaw blade.

40 Claims, 18 Drawing Sheets

U.S. PATENT DOCUMENTS

| | | | |
|---|---|---|---|
| 4,388,670 | 6/1983 | Billhartz | 361/662 |
| 4,690,483 | 9/1987 | Carris | 439/517 |
| 4,772,213 | 9/1988 | Bell et al. | 439/135 |
| 4,823,572 | 4/1989 | Signorelli | 439/167 |
| 4,892,485 | 1/1990 | Patton | 439/517 |
| 4,977,482 | 12/1990 | Landgon et al. | 361/661 |
| 5,023,747 | 6/1991 | Lindsay | 361/117 |
| 5,088,004 | 2/1992 | Howell | 361/669 |
| 5,129,841 | 7/1992 | Allina et al. | 439/517 |
| 5,145,403 | 9/1992 | Schaffert et al. | 439/508 |
| 5,145,422 | 9/1992 | Fry | 439/856 |
| 5,181,166 | 1/1993 | Howell | 361/659 |
| 5,207,595 | 5/1993 | Learmont et al. | 439/517 |
| 5,385,486 | 1/1995 | Robinson et al. | 439/517 |
| 5,423,695 | 6/1995 | Robinson et al. | 439/517 |
| 5,571,031 | 11/1996 | Robinson et al. | 439/517 |
| 5,577,933 | 11/1996 | Robinson et al. | 439/517 |
| 5,586,913 | 12/1996 | Robinson et al. | 439/638 |
| 5,588,874 | 12/1996 | Pruehs et al. | 439/517 |
| 5,590,179 | 12/1996 | Shincovich et al. | 379/106.06 |
| 5,704,804 | 1/1998 | Robinson et al. | 439/517 |

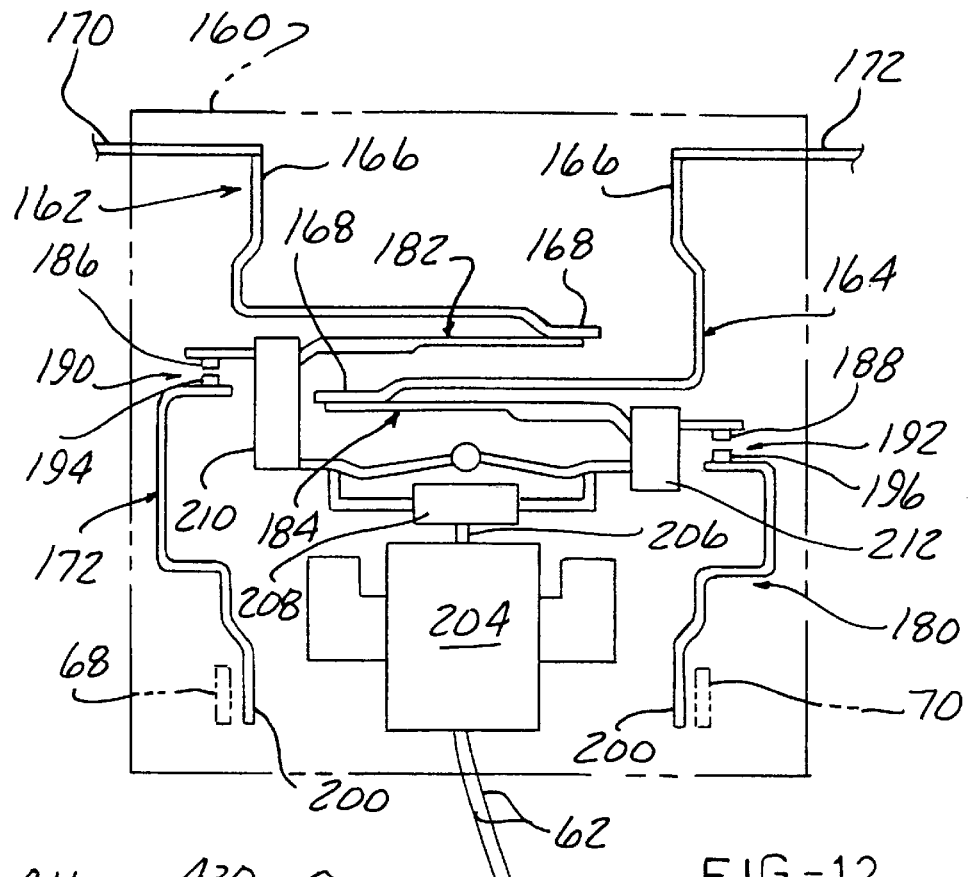
FIG-12
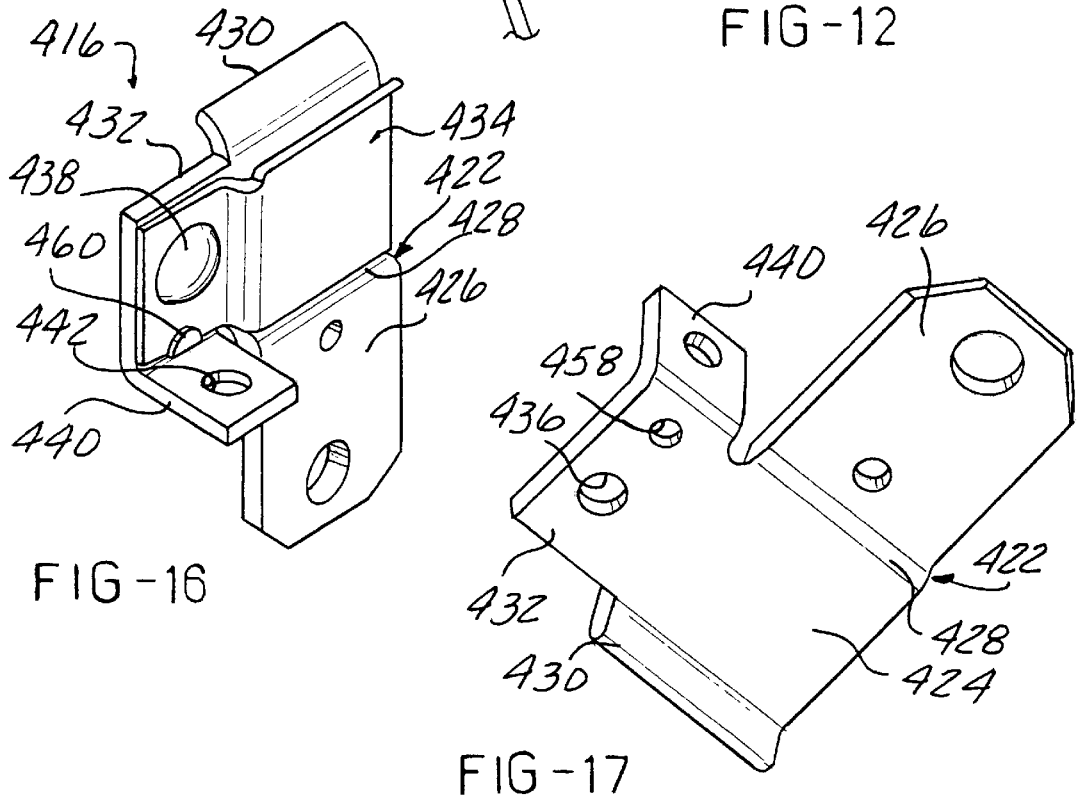
FIG-16
FIG-17

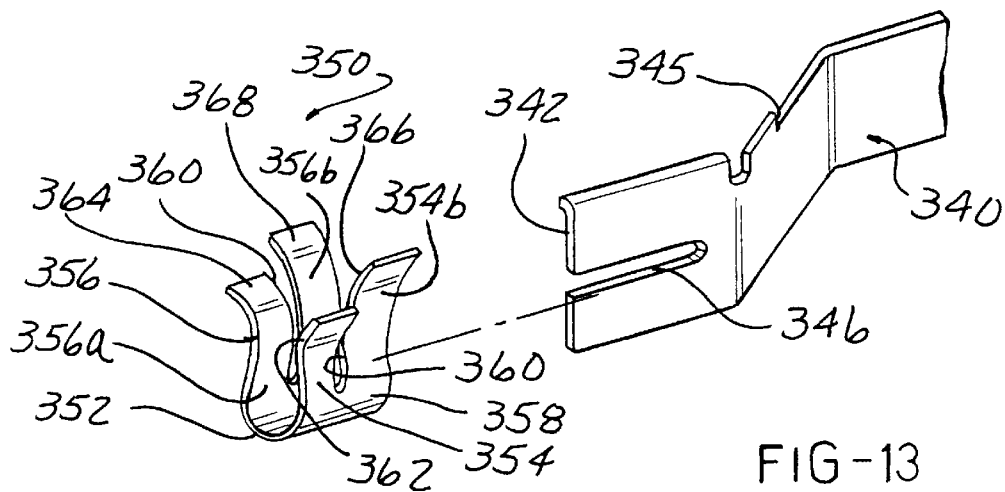
FIG-13
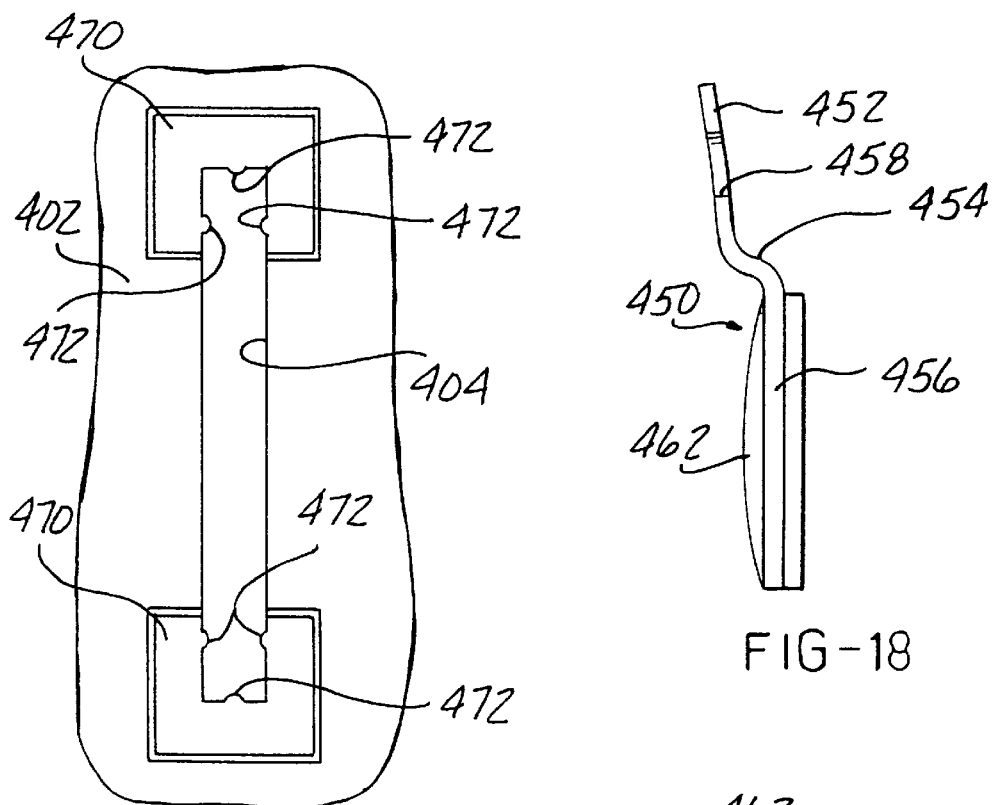
FIG-21
FIG-18
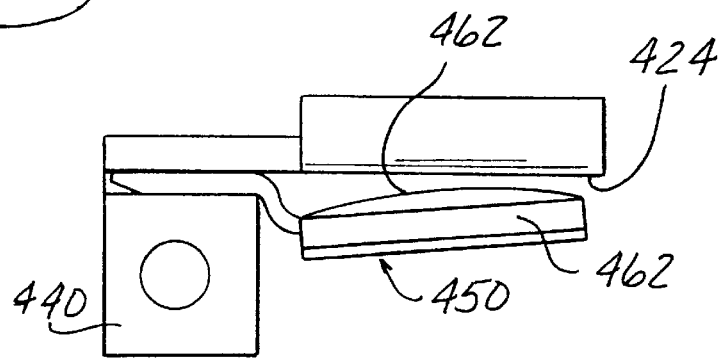
FIG-19

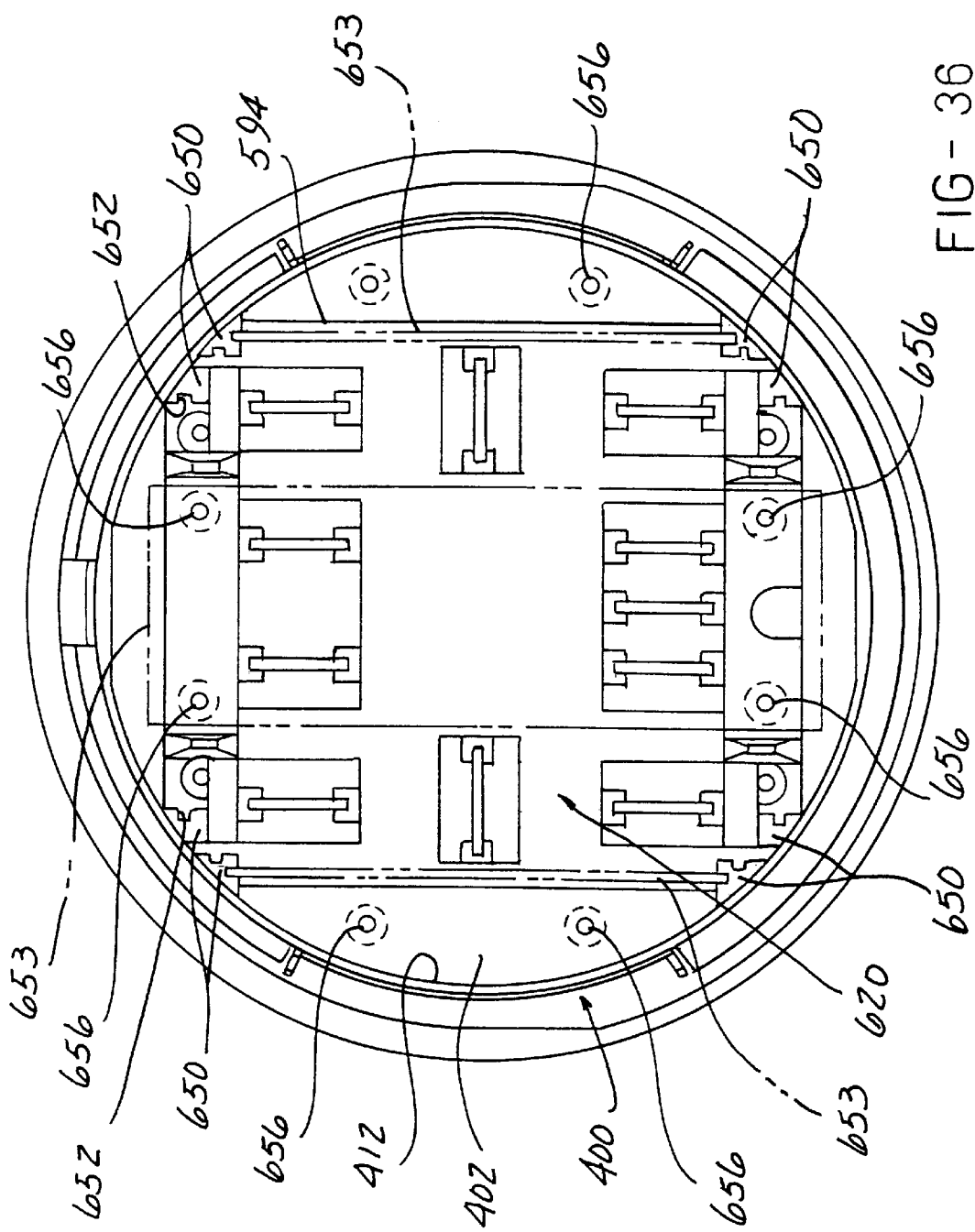

JAW BLADES FOR WATTHOUR METER SOCKET ADAPTER

CROSS REFERENCE TO CO-PENDING APPLICATION

This application claims the benefit of Provisional Application Seri. No. 60/057,537, filed Sep. 4, 1997, in the names of Darrell Robinson and Allen Pruehs and entitled "Jaw Blades for Watthour Meter Socket Adapter" and Provisional Application Ser. No. 60/064,355, filed Oct. 30, 1997, in the names of Darrell Robinson, Allen Pruehs and Karl R. Loehr, and entitled "Watthour Meter Socket Adapter."

BACKGROUND OF THE INVENTION

1. Field of the Invention

The present invention relates, in general, to electrical watthour meters and, specifically, to watthour meter mounting enclosures for socket adapters and, more specifically, to jaw blades for watthour meter socket adapters.

2. Description of the Art

Electrical power is supplied to an individual site or service by external electrical power line conductors located above or below ground. In a conventional arrangement, electrical power line conductors are connected to terminals in a watthour meter socket mounted on a building wall. Electrical load conductors are connected to another set of terminals in the meter socket and extend to the electrical distribution network in the building. A watthour meter is connected to both pairs of terminals in the meter socket to measure the electric power drawn through the load conductors.

Due to the current trend toward the use of plug-in watthour meters, A to S type socket adapters have been devised which convert A-base type bottom connected watthour meter sockets to receive plug-in watthour meters. Another type of socket adapter has been devised which allows the installation of other devices between the watthour meter socket and a plug-in watthour meter.

Such socket adapters employ a generally annular base having a shell joined thereto and extending outward from one side of the base. Jaw contacts are mounted in the shell and base. Each jaw contact has a female jaw portion disposed interiorly within the shell and a male blade terminal connected to the female jaw portion and extending outward through the base for plug-in connection to the terminals in the meter socket housing.

In previous watthour meter socket adapters, the jaw contacts were of two different constructions. In one construction, the jaw contacts have a folded over design formed of a base wall fixedly mounted by a fastener to the shell of the socket adapter and two spaced sidewalls extending therefrom. The outer ends of the sidewalls are folded over inwardly between the sidewalls and terminate in parallel end flanges which slidably receive a blade terminal of a watthour meter. A blade terminal is usually fixedly connected to the base wall of the jaw contact for connection to jaw contact in a meter socket.

In the second construction, the jaw contacts are formed of a generally planar terminal having opposed first and second ends. An angularly bent spring clip is riveted at one end to an intermediate portion of the terminal and extends to a contact edge disposed in separable engagement with the first end of the terminal to form a jaw for receiving the blade terminal of a watthour meter. The spring clip forcibly biases the watthour meter terminal into secure electrical engagement with the terminal. The second end of the blade terminal extends exteriorly from the base of the watthour meter socket adapter for releasable engagement in a socket jaw contact. A cotter pin is inserted through an intermediate aperture in the terminal to fixedly mount the terminal and jaw contact in position in the watthour meter socket adapter.

The power rating or current carrying capacity of a jaw contact used in a watthour meter socket adapter is determined, in part, by the amount of conductive metal employed in the construction of the jaw contact. It is also known that heat generated within the watthour meter socket adapter or in the jaw contact itself adversely effects the maximum current the jaw contact can carry, with higher temperatures significantly decreasing the maximum current capacity of a jaw contact.

Watthour meter socket adapters have also been provided with power disconnect devices, such as circuit breakers or ground fault circuit interrupters, both for protecting the electrical service as well as, in certain applications, to limit the amount of power supplied to the site, as shown in U.S. Pat. No. 5,572,396. Such power disconnect devices have also been remotely controlled, such as by signals over conductors from the utility company, to temporarily or permanently disconnect electrical power service to a particular site.

However, such power disconnect devices or switches generate a considerable amount of heat within the interior of the watthour meter socket adapter. This heat lowers the maximum current carrying capability of the jaw contacts within the socket adapter. Thus, it would be desirable to provide a jaw contact structure which is capable of dissipating higher quantities of heat so as to increase the maximum current carrying capability of the jaw contact.

In a typical socket adapter, the socket adapter is formed with a base having a bottom wall and a surrounding peripheral flange. A shell is provided with a bottom wall and an annular sidewall extending from the bottom wall to an end mounting flange which mates with a corresponding mounting flange on a watthour meter. The bottom wall of the shell mates with the peripheral flange on the base and is secured thereto, typically by fasteners extending through the bottom walls of both of the shell and base. Aligned slots are formed in the bottom walls of the shell and base and receive jaw blades which have a blade terminal at one end extending through one aligned slot and a jaw contact at an opposed end for mating engagement with a blade terminal on a watthour meter. The blade terminals of each jaw blade extend exteriorly of the bottom wall of the base for releasable engagement with jaw contacts in a watthour meter socket.

The two spaced bottom walls in the shell and base of such a watthour meter socket adapter construction hold the jaw blades without sideways movement. Such jaw blades are typically fixed in position by cotter pins extending through apertures in the exterior portion of the blade terminal of each jaw blade.

While previously devised watthour meter socket adapters function effectively in releasibly connecting a plug-in watthour meter to the watthour socket jaw contacts, it is believed that further improvements can be made to such watthour meter socket adapters to reduce the manufacturing cost of such socket adapters by simplifying the manufacturing steps in constructing and assembling watthour meter socket adapters. It would also be desirable to provide a watthour meter socket adapter having a one piece construction without a separate shell and base. It would also be desirable to provide an improved watthour meter socket adapter in which the jaw blades are supported from sideways movement. It would also be desirable to provide a watthour meter socket adapter with integral means for non-movably mounting each jaw blade in the socket adapter.

SUMMARY OF THE INVENTION

The present invention is an improved jaw blade apparatus for use in a watthour meter socket adapter.

One embodiment of the present invention comprises a jaw blade for a watthour meter socket adapter which is mounted in a housing for receiving line blade terminals of a watthour meter in a spring biased connection and, also, for electrically engaging jaw contacts in a watthour meter socket. In one embodiment, the jaw blade of the present invention is in the form of a planar conductive member having a blade terminal end and an opposed jaw contact end. An aperture is formed in the planar member and spaced from the jaw contact end to receive a spring clip in a slide-in connection. The spring clip is formed with at least a pair of resilient side legs, one of which normally engages the jaw contact end of the jaw blade while the other is spaced from the jaw contact end to define a slot capable of receiving a blade terminal of a watthour meter. The spring clip biases the jaw contact end of the jaw blade into secure electrical engagement with the blade terminal of a watthour meter or other electrical device.

At least one flange extends from the planar member to form a large heat dissipation surface to maximize the current carrying capability of the jaw blade. An angularly disposed flange also extends from the planar blade, generally intermediate the blade terminal end and the jaw contact end, for guiding an external electrical conductor to the jaw blade.

Edges on the jaw blade seat on the base surface of the housing of the watthour meter socket adapter to position and mount the jaw blade within the housing eliminating the need for a separate aperture and a separate base in the shell. In addition, the spring clip slides into the slot in the jaw blade and is operable without the need for additional fasteners, such as rivets, as previously employed in prior art watthour meter socket adapter jaw blades or jaw contacts.

In another exemplary embodiment, a remotely controlled switch means is mounted in the housing and electrically connected between one pair of line or load jaw terminals and a corresponding pair of line or load blade terminals for selectively electrically connecting the line jaw terminals to the line blade terminals or the load jaw blade terminals to the load blade terminals. In this exemplary embodiment, the jaw blade is formed of two separate elements, a first element including a jaw contact and an enlarged heat dissipation surface extending to an opposed end connected to contact elements within the switch and a separate blade terminal connected to the contacts of the switch.

The present invention is an electrical watthour meter socket adapter which includes improved jaw blade and jaw blade mounting structure.

The watthour meter socket adapter comprises a housing having a base wall and an annular sidewall extending from the base. A plurality of apertures are formed in the base wall for receiving individual jaw blades therethrough. At least one jaw blade is mounted in one of the apertures. The jaw blade includes a jaw portion disposed within the housing and a blade portion extending through the aperture in the base wall for insertion into a jaw contact of a watthour meter socket. A spring clip is mounted in the jaw portion to define an opening for receiving a watthour meter blade terminal therebetween. The spring clip has first and second resilient side legs slidably mounted in the jaw portion of the jaw blade with one side leg spaced from the jaw portion of the jaw blade. Preferably, an opened ended aperture is formed in the jaw contact portion of the jaw blade with the spring clip mountable in the aperture.

Means, unitary with the jaw contact portion, support the jaw portion on the base. The spring clip has a first end and a second end, the second end has an angled edge. A fastener insertable through the second end urges the angled end into co-planar alignment with the remainder of the second end.

The first end has a raised center extending from a plane containing outer side edges of the first end. The raised center faces the jaw portion of the jaw blade when the spring clip is mounted on the jaw blade.

Means non-movably mount the jaw blade on the base. The mounting means includes means for non-movably supporting the jaw blade with respect to the base. A pair of ribs project from the base and engage opposite sides of the blade terminal of the jaw blade.

In another embodiment, a tab projects angularly from the jaw portion for engagement with the base to non-movably support the jaw portion relative to the base. At least a pair of projections are formed on the base and extend into the aperture in the base. The projections engage the blade portion of the jaw blade for non-movably supporting the jaw blade in the aperture.

In another embodiment, the spring clip is unitarily formed with the jaw blade. The spring clip is formed of a pair of resilient arms unitarily projecting from the jaw portion to outer ends spaced from the jaw portion.

In another embodiment, the jaw blade terminal is formed of an elongated, one piece unitary member having a jaw portion at one end and a blade portion at an opposed end. The spring clip is mounted on the jaw contact portion and has an end spaced from the jaw contact to define a blade terminal receiving slot therebetween. At least one side flange is unitarily formed with the jaw portion and projects angularly from a plane of the jaw portion. The side flange has an end edge engagable with the base to substantially prevent movement of the jaw portion with respect to the base when the jaw blade is disposed in the aperture in the base.

The jaw blades of the present invention provide numerous advantages over previously devised jaw blades used in electric watthour meter socket adapters. In each of the various embodiments disclosed herein, the jaw blades have a simplified structure for ease of manufacture. This reduces the manufacturing cost of the socket adapter. In addition, certain embodiments of the jaw blades utilize only a single mechanical fastener to fix the spring clip to the jaw blade thereby reducing assembly steps and component costs.

The unique mounting means provided in the base of the one piece unitary base and sidewall socket adapter non-movably support the jaw blades relative to the base without the need for additional mechanical fasteners. This again reduces the manufacturing cost of the socket adapter as well as simplifying its assembly.

In one unique embodiment, the spring clip is unitarily formed as a one piece unitary part of the jaw blade. This has a significantly reduced manufacturing cost. Apertures formed in the resilient arms of the spring clip can be varied in size to control the degree of resiliency of the spring clip arms and thereby the engagement force urging a blade terminal inserted between the spring clip arms and jaw portion of the jaw blade into contact engagement with the jaw portion.

BRIEF DESCRIPTION OF THE DRAWINGS

The various features, advantages and other uses of the present invention will become more apparent by referring to the following detailed description and drawing in which:

FIG. 12 is a plan view showing the contact structure of the switch shown in FIGS. 1, 2 and 11;

FIG. 13 is an exploded, perspective view of another embodiment of a jaw blade according to the present invention;

FIG. 16 is a enlarged, perspective view of one of the jaw blades shown in FIGS. 14 and 15;

FIG. 17 is a perspective view of a bus bar portion of the jaw blade shown in the FIG. 14;

FIG. 18 is a bottom elevational view of the spring clip shown in FIG. 16;

FIG. 19 is a side plan view of the assembled jaw blade shown in FIG. 16;

FIG. 21 is an enlarged, partial view of one of the jaw blade mounting apertures depicted in FIG. 20;

FIG. 36 is a plan view showing circuit board mounts in a socket adapter; and

DESCRIPTION OF THE PREFERRED EMBODIMENTS

Figure 1:
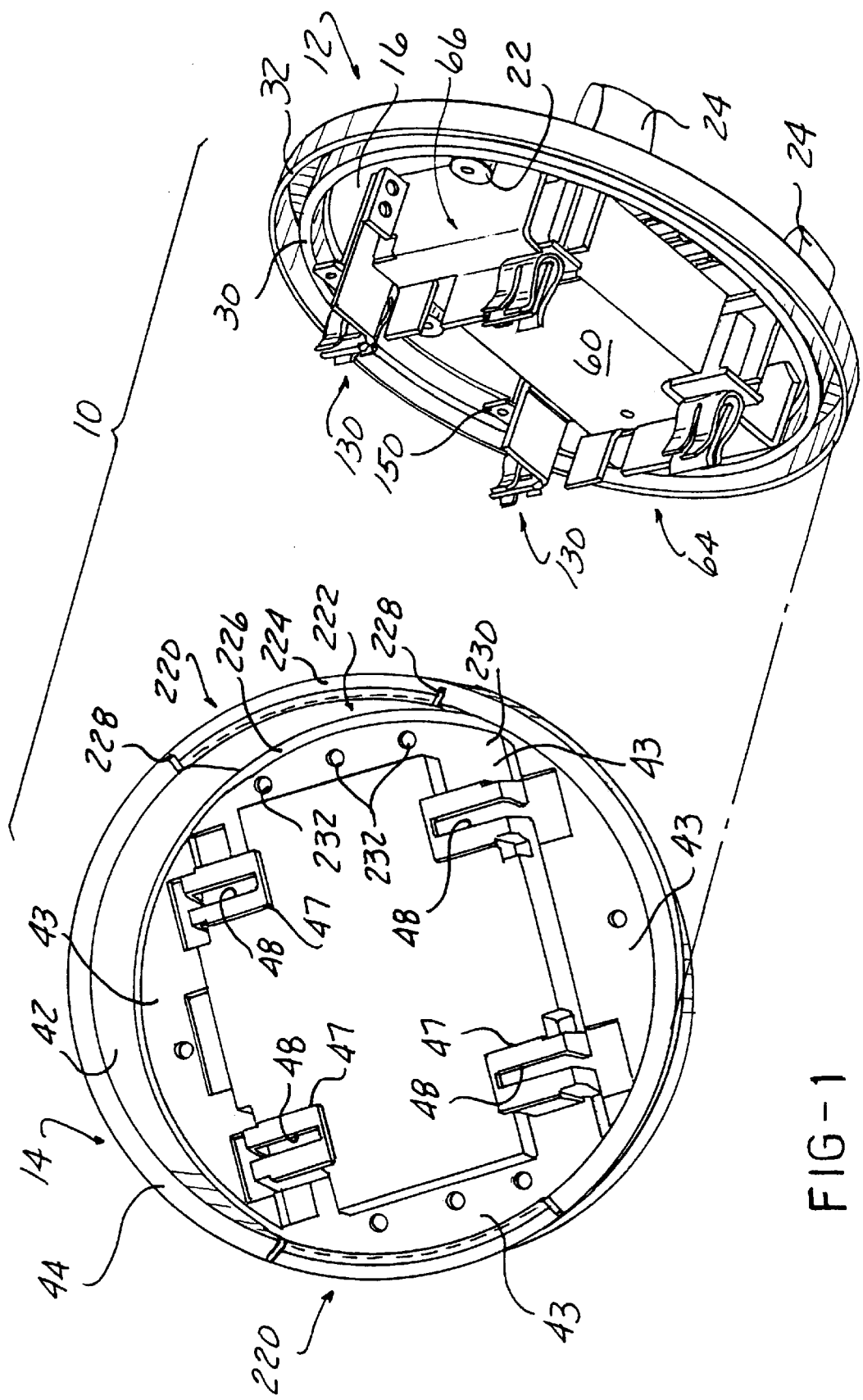
FIG. 1 is an exploded, perspective view showing a jaw blade of the present invention mounted in a watthour meter socket adapter.
Figure 3:
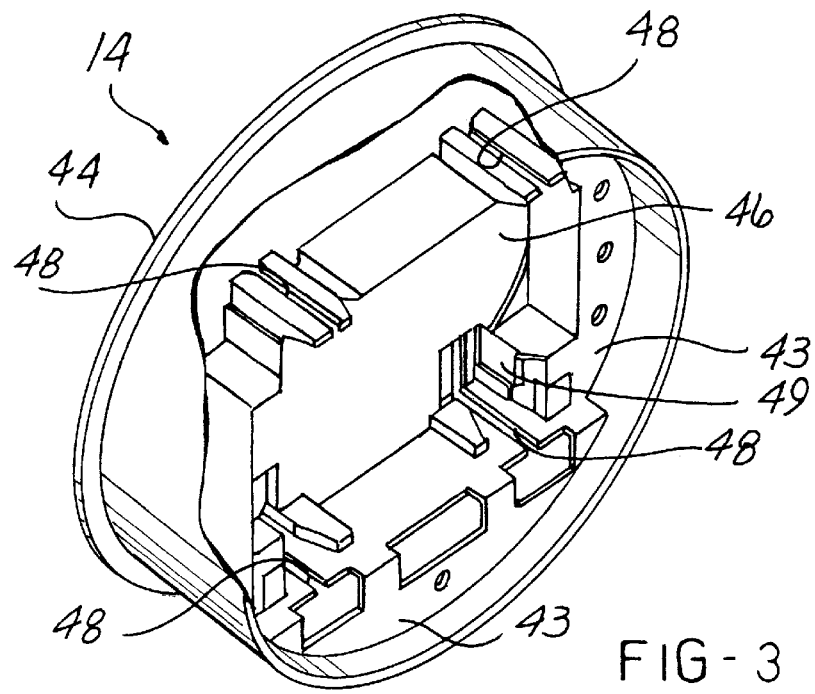
FIG. 3 is a partially broken-away, rear, perspective view of the shell of the socket adapter shown in FIG. 1.
Figure 2:
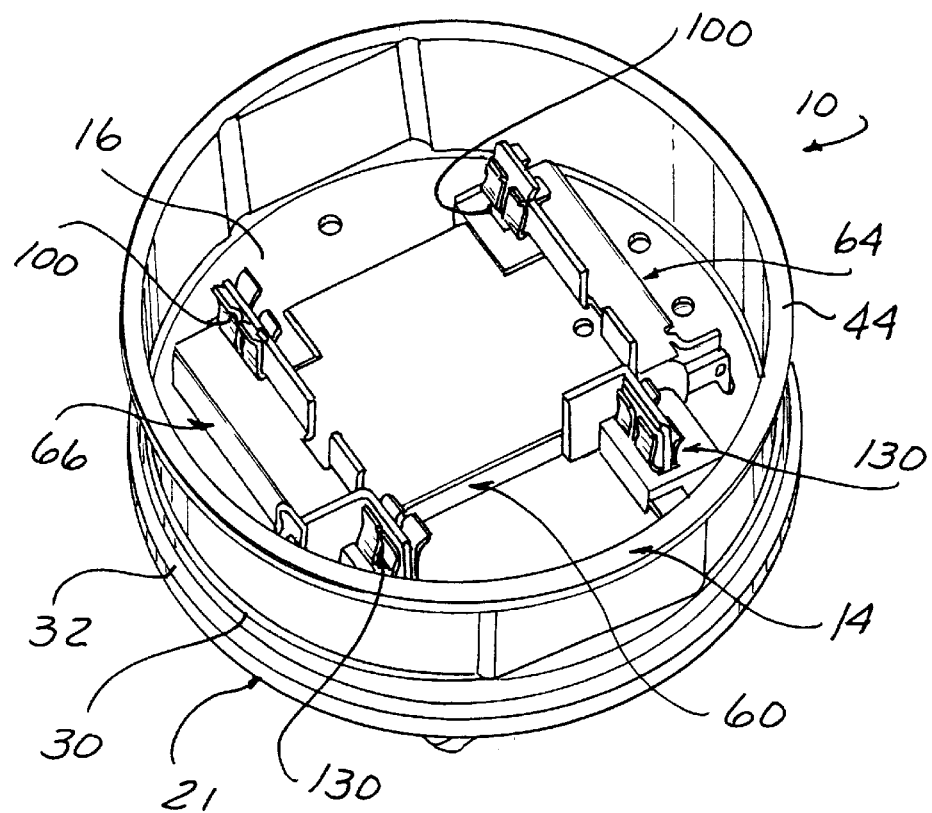
FIG. 2 is a perspective view of the watthour meter socket adapter shown in FIG. 1, with the dead front shield portion of the shell removed.

In order to better describe and appreciate the advantages of the present invention, a description of the conventional construction of an electric watthour meter socket adapter or socket extender/adapter, both hereafter referred to as a socket adapter, will be provided with reference to FIGS. 1 and 2. A conventional socket adapter 10 includes contacts designed to receive blade terminals of a conventional electric watthour meter, not shown, in a releasible connection. The socket adapter 10 includes terminals, described hereafter, which plug into mating contacts in a watthour meter socket. The number of contacts and terminals in the socket adapter 10 will vary depending upon the type of electric service at a particular user site, FIG. 1 depicts, by way of example only, a single phase electric service.

As shown in FIGS. 1, 2, 3, 6 and 11, the socket adapter 10 includes a base portion 12 and a shell portion 14 which are fixedly joined together by suitable means, such as fasteners. The base 12 has a central wall 16 of generally circular shape. A plurality of generally rectangular bosses 18 are formed on the central wall 16. Each of the bosses 18 has a slot 20 formed therein which extends completely through each boss 18 and the central wall 16 to receive a blade terminal therethrough, as described hereafter. A plurality of cylindrical bosses 22 are also formed on and extend outward from one surface of the central wall 16. Through bores are formed in each boss 22 for receiving a fastener to join the shell 14 to the base 12. A plurality of outwardly extending legs 24 are formed on a back surface of the central wall 16 and are provided in an appropriate number and spaced from one of the contacts or blade terminals which extends through the base 12.

An annular, raised, inner peripheral edge flange 30 is formed on the base 12 and extends outward from one surface of the central wall 16. An outer peripheral edge flange 32 is spaced radially outward from the inner flange 30. A plurality of circumferentially spaced ribs 34 extend radially between the inner and outer peripheral edge flanges 30 and 32.

The inner peripheral edge flange 30 includes an annular seat for receiving a peripheral edge portion of the shell 14 when the shell 14 is engaged with the base 12. The outer peripheral edge flange 32 extends radially outward from the inner peripheral edge flange 30 and forms a mounting flange which mates with the mounting flange on the cover of the watthour meter socket, not shown. A conventional sealing ring, also not shown, is employed to surround and lockingly join the outer peripheral edge flange 32 to the mounting flange on the meter socket.

The shell 14 of the socket adapter 10 is formed with a generally annular sidewall 42. The sidewall 42 terminates in an enlarged diameter exterior end mounting flange 44. The mounting flange 44 is designed to mate with a corresponding mounting flange on a conventional watthour meter, not shown. A sealing ring, not shown, may be employed to encompass and lockingly connect the mounting flange 44 on the shell 14 and the mounting flange on a watthour meter.

The annular sidewall 42 of the shell 14 has an opposed annular edge 45 spaced from the exterior end mounting flange 44. A generally solid wall 46 is integrally connected to the sidewall 42 by a plurality of flanges 43 and is spaced between the exterior mounting flange 44 and the opposed edge 45. The wall 46 projects above the flanges 43 and acts as a dead front or safety shield covering all of the exposed portions of the jaw blade and the disconnect switch, described hereinafter in a cavity between the base 12 and the shell 14.

Figure 11:
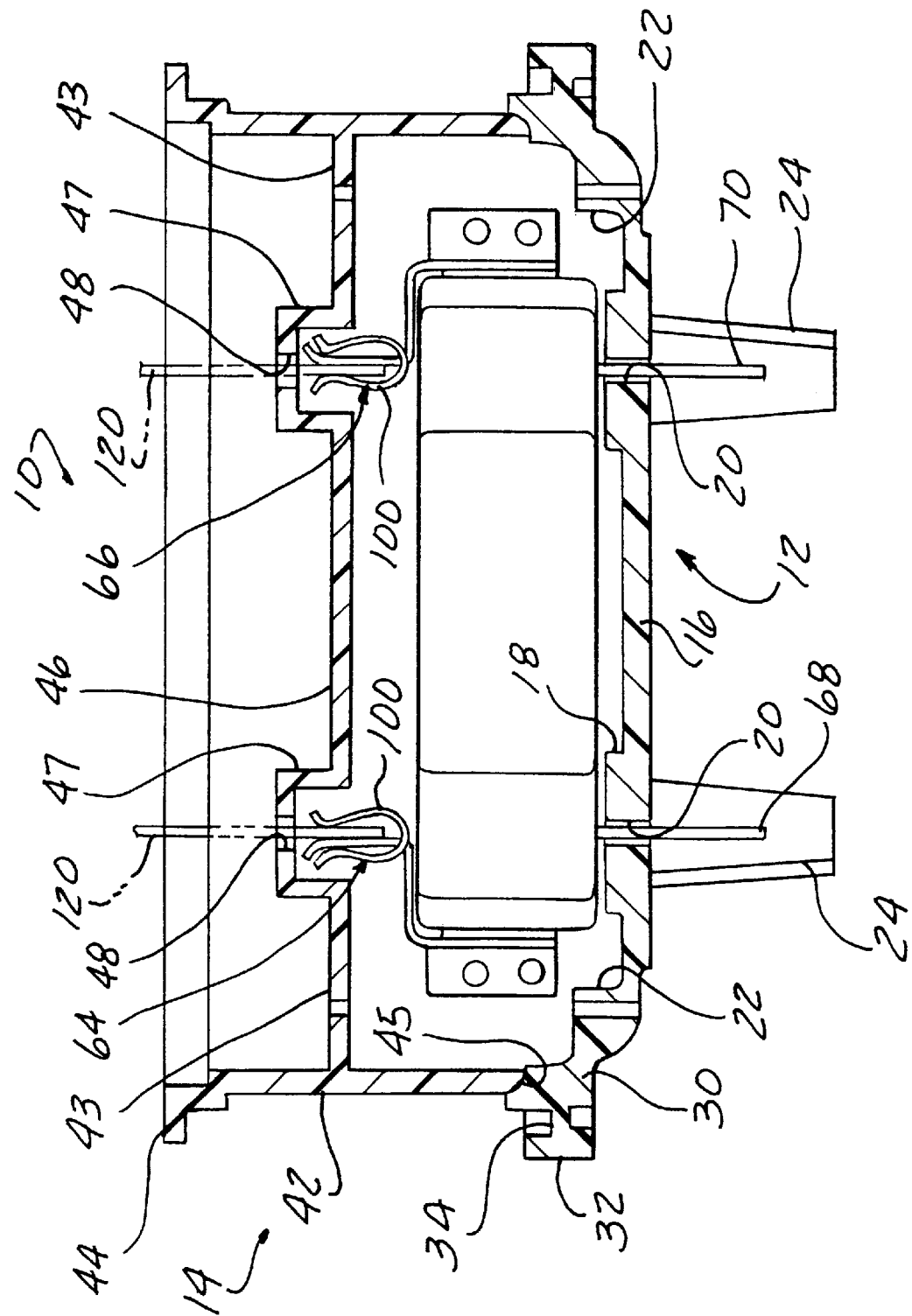
FIG. 11 is a partially cross-sectioned, end view of FIGS. 1 and 2.

The wall 46 has a plurality of raised bosses 47, each of which includes a slot 48 defining an opening for receiving a blade terminal 120 of an electrical device, such as a watthour meter, therethrough as shown in FIG. 11. Each raised boss 47 extends a short distance above the generally planar wall 46 and forms a recess or cavity 49 on the back surface of the wall 46 which receives and locates a jaw blade mounted on the base 12. Each slot 48 extends across the planar wall 46 and down a sidewall connecting the planar wall 46 to one flange 43 to permit easy angular insertion and removal of blade terminals through the slots 48.

As shown in FIG. 1, at least one and preferably two identical surge ground conductors 220 are diametrically mounted opposite each other on the mounting flange 44 of the shell 14. Each surge ground conductor 220 is removably mounted in one pair of slots in the mounting flange 44 and includes an arcuate wall portion 222 which conforms to the inner diameter of the annular sidewall 42 of the shell 14. The arcuate wall portion 222 has an upper edge 224 and a lower edge 226. A pair of radially extending tabs 228 are formed on opposite side ends of the arcuate wall portion 222 generally adjacent the upper edge 224. Each tab 228 seats in the slots on the mounting flange 44 of the shell 14. Each tab 228 has an upper edge disposed slightly above the upper edge of the mounting flange 44. This places the upper edge of each surge ground conductor 220 at a position to electrically engage a ground terminal mounted on the rear surface of a conventional watthour meter.

Each surge ground conductor 220, as shown in FIG. 1, has a mounting foot or tab 230 connected to the lower edge 226 of the arcuate wall portion 222. The mounting foot 230 has a generally planar shape with apertures 232 positioned to receive fasteners to secure each surge ground conductor 220 to one of the bosses 22 in the base 12. Each aperture 232 is formed as a stamped threaded aperture so as to receive a threaded screw without need for a nut.

Referring now to FIGS. 2 and 4–8, there is depicted one embodiment of a jaw blade 130 which may be employed in the socket adapter 10. It will be understood that the following description of the jaw blade 130 as a line jaw blade is by way of example only as the jaw blade 130 may also be used as a load jaw blade in a socket adapter with or without an internally mounted disconnect switch.

Figure 7:
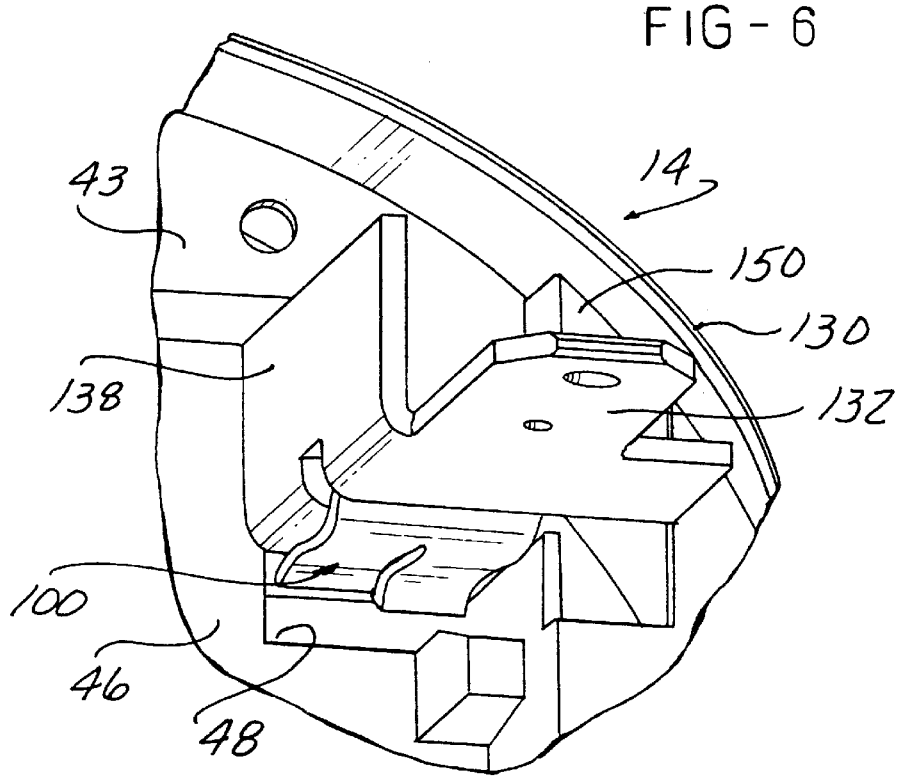
FIG. 7 is an enlarged, perspective view of the rear end of the socket adapting showing the jaw blade of FIGS. 4–6.
Figure 8:
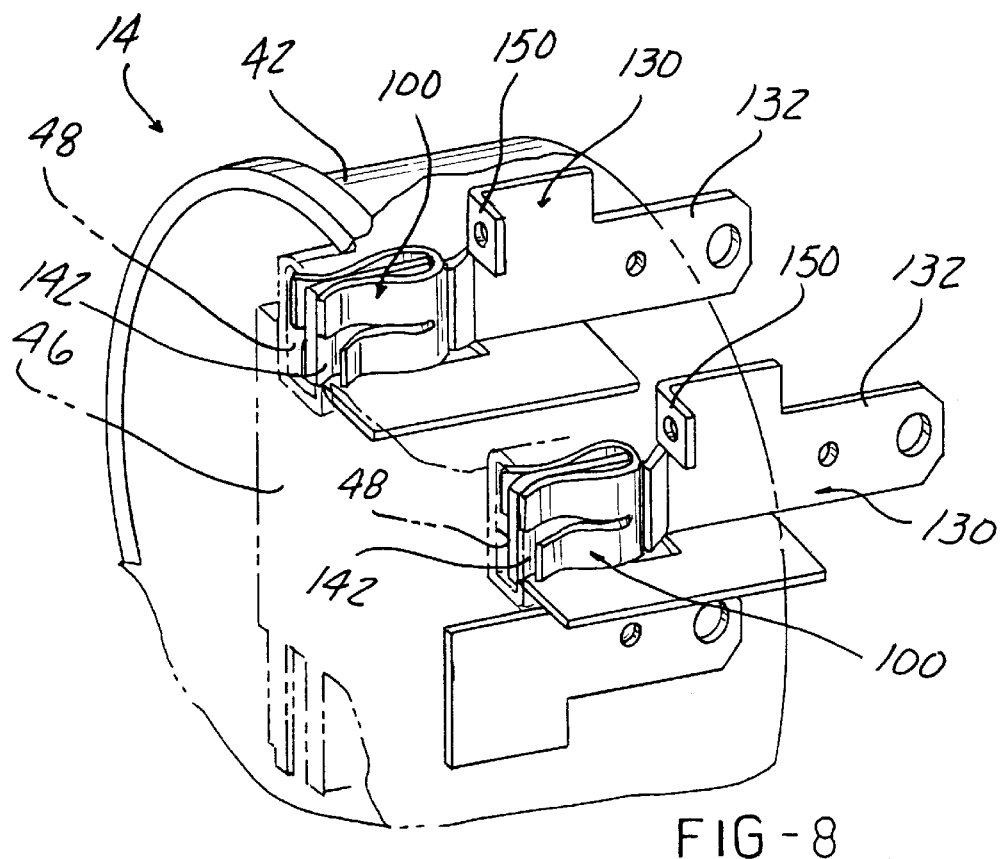
FIG. 8 is a partially broken-away, front perspective view showing the mounting of the line jaw blades of FIGS. 4–7 in the shell of the socket adapter shown in FIG. 2.

The line jaw contact 130 includes a generally planar blade end 132 having a first end 134 configured as a blade terminal for extension through the aperture 20 in the central wall 16 of the base 12 and removable insertion into a jaw contact in a watthour meter socket, not shown. The opposed end 136 of the jaw blade 130 extends angularly outward from a jaw contact end 142 to form a guide surface for guiding a blade terminal 120 of a watthour meter into contact with the jaw contact 130 as shown in FIG. 11. An end wall or flange 138 extends partially between second end 136 to the first end 134 and angularly or perpendicularly from the planar portion 132 of the jaw blade 130 as shown in FIGS. 7 and 8. The flange 138 provides a large heat dissipation surface to enable the jaw blade 130 to carry increased load current. Further, the flange 138 seats against the wall 46 in the shell and the central wall 16 of the base to limit movement of the jaw blade 130.

A notch 140 extends transversely through the blade end 132 between the first and second ends 134 and 136. The notch 140 receives a base 102 of a spring clip 100. An angled flange 141 is formed at the edge of the blade end 132 adjacent one side edge of the notch 140. The flange 141 floatingly locates the spring clip 100, inserted therein, in engagement with the jaw contact end 142 of the jaw blade 130 and prevents the spring clip 100 from sliding toward the inner closed end of the notch 140.

The spring clip 100 is formed of a spring or resilient metal, such as spring steel, and is formed of the base portion 102 and a pair of side legs 104 and 106 which extend outward from opposite ends of the base 102. Each of the side legs 104 and 106 has a smoothly curved, arcuate shape formed of a bottom portion 108 which combines with the mating U-shaped bottom portion of the spring clip 100. A pair of generally planar, intermediate walls 110 project from the bottom portion 108 and terminate in outwardly angled, generally smoothly curved ends 112. Engagement or contact surfaces 114 and 116 are respectively formed adjacent the ends 112 of the side legs 104 and 106. The contact surface 114 on the side leg 104 engages one surface of the jaw contact end 142. The opposed contact point 116 on the side leg 106 is normally spaced from the jaw contact end 142 to form a slot therebetween which is capable of receiving a blade terminal 120 of a watthour meter or other electrical device therein. The side legs 104 and 106 bias the blade terminal 120 into secure electrical engagement with the jaw contact end 142 of the jaw blade 130.

Figure 4:
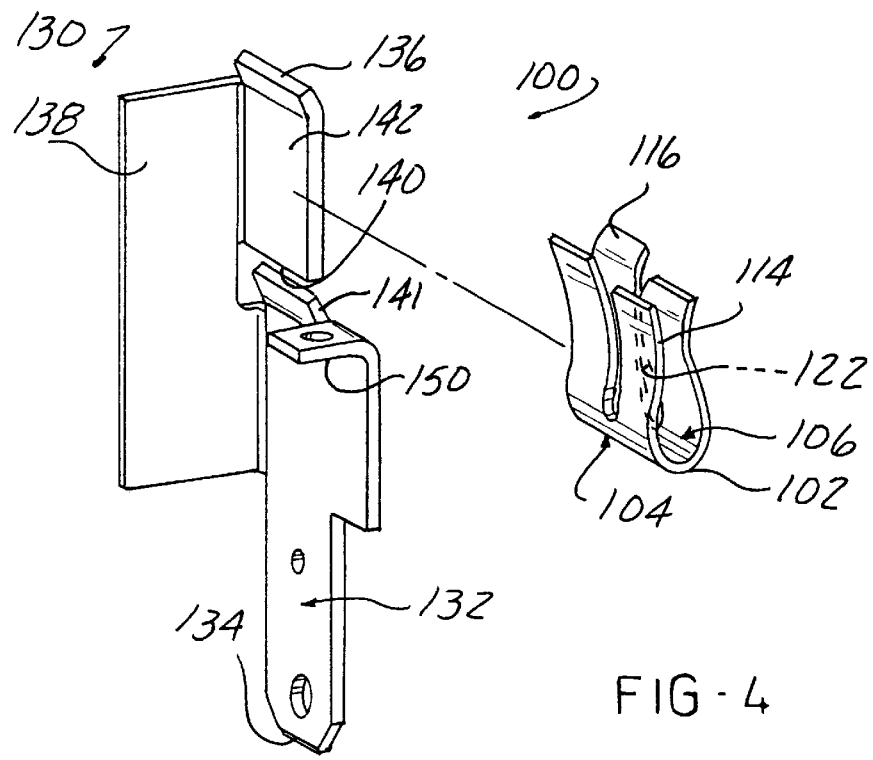
FIG. 4 is an exploded, perspective view of one embodiment of a jaw blade according to the present invention.
Figure 5:
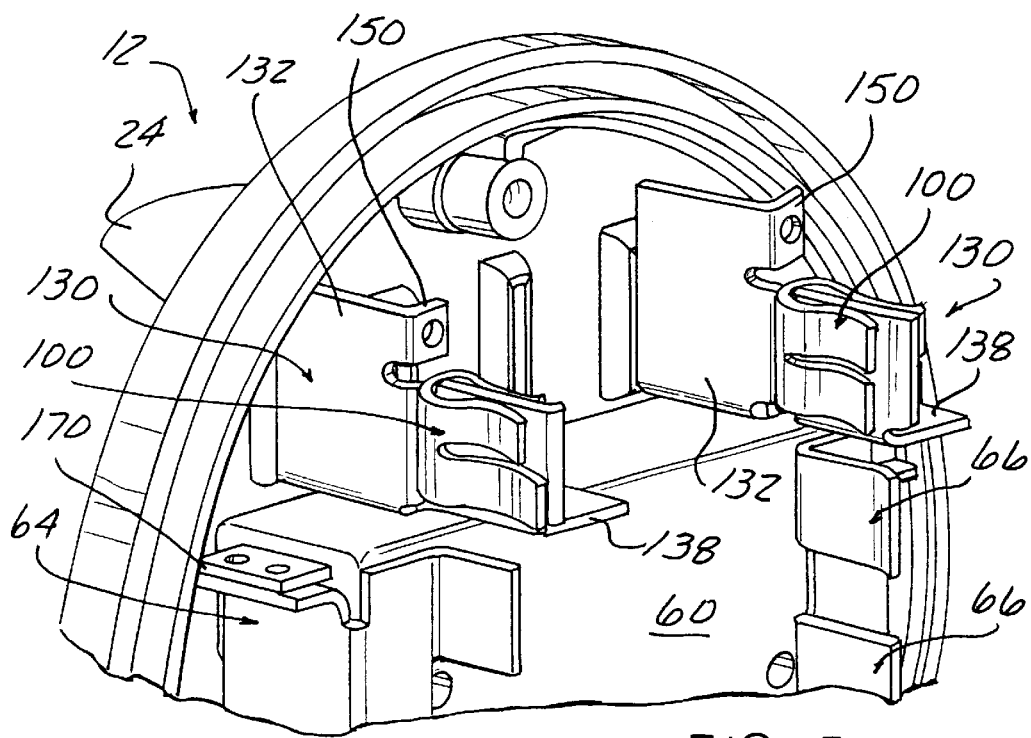
FIG. 5 is an enlarged, perspective view of the jaw blade of FIG. 4 mounted as line jaw blades in the socket adapter of FIGS. 1 and 2.
Figure 6:
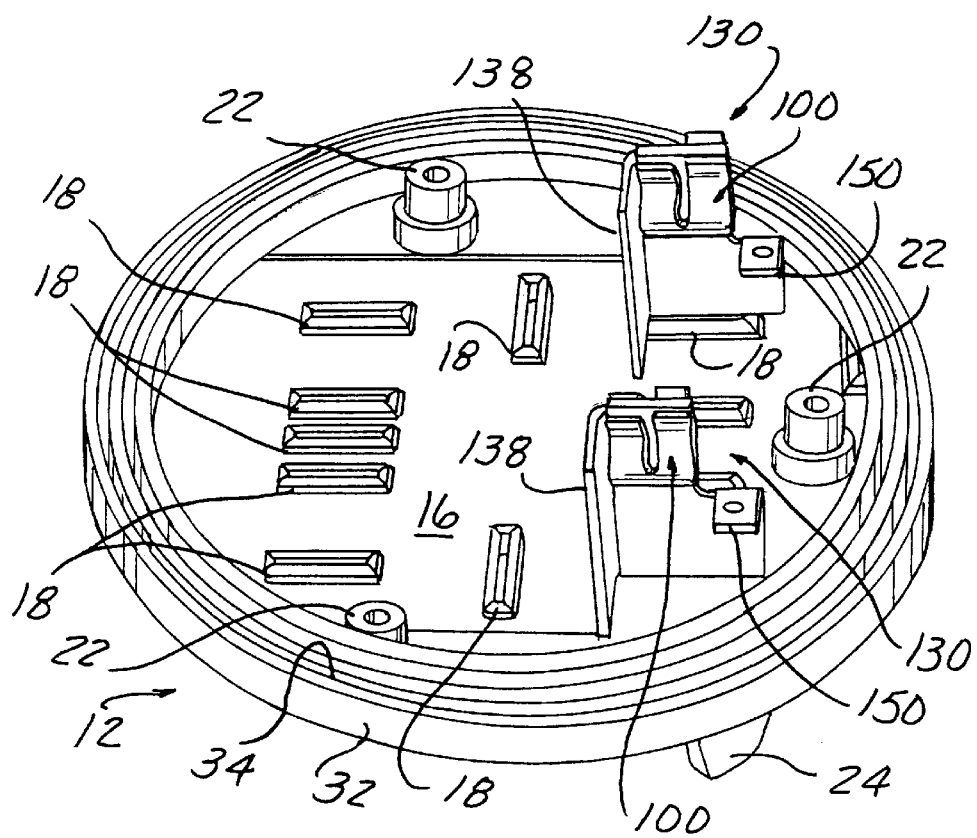
FIG. 6 is an enlarged, perspective view showing the mounting of the line jaw blades of FIG. 4 in the base of the socket adapter, with the switch, line jaw blades and shell removed.
Figure 10:
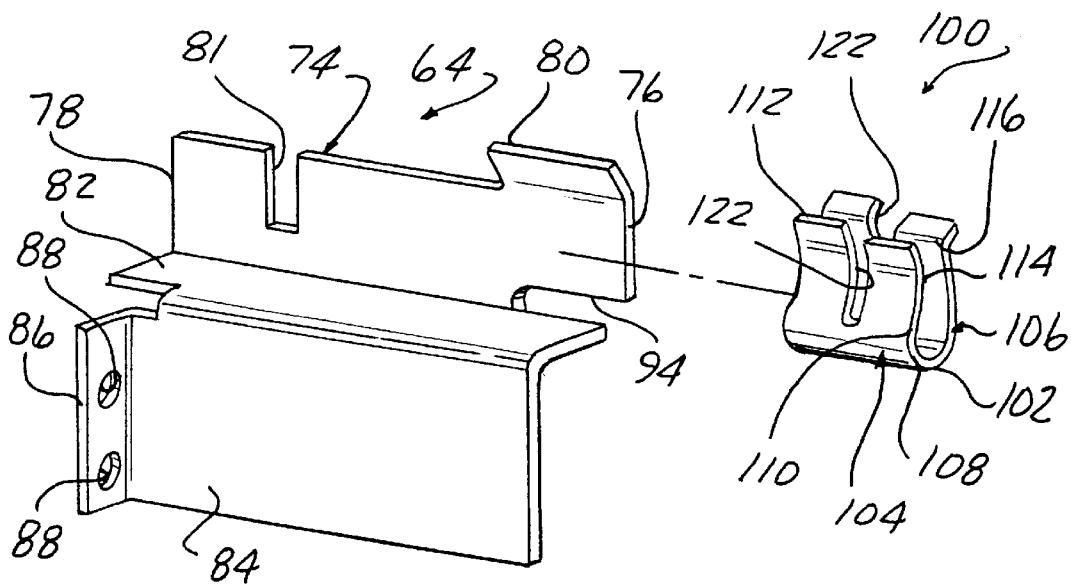
FIG. 10 is an enlarged, partially exploded, perspective view of a second embodiment of the jaw blade of the present invention.

As shown in FIG. 4, at least one and preferably both of the side legs 104 and 106 may have a generally centrally located slot 122 which divides each side leg 104 or 106 into a pair of spaced leg portions. The slot 122 in each of the side legs 104 and 106 forms a pair of laterally spaced contact fingers along the length of each spring clip 100. The location of the contact surfaces 114 and 116 on each of the fingers may be disposed at the same height from the bottom 108 of the spring clip 100 for each pair of laterally spaced contact fingers. Alternately, as shown in FIG. 10, the contact surfaces of one pair of contact fingers may be offset from the contact surfaces of one pair of contact fingers and arranged above or below the contact surfaces of the other pair of contact fingers. This has the effect of staggering or offsetting the insertion or push-in force required to insert a blade terminal, such as a blade terminal of a watthour meter, into the jaw blade contact 130 since the total opposing force exerted by the spring clip 100 is staggered and comes into play in two steps. Either of the pairs of contact fingers may be disposed higher or lower than the other pair of fingers.

In this manner, the side leg 106 of the spring clip 100 will be disposed adjacent to and in contact with the end portion of the blade end 132 adjacent to the angularly disposed end 136. The opposed sidewall 134 is spaced from the end portion 142 by a distance to slidably and snugly receive a blade terminal 120 of a watthour meter therebetween. The side legs 104 and 106 of the spring clip 100 biasingly force the blade terminal 120 and the end portion 142 of the jaw blade 130 into secure electrical engagement.

A fastener receiving flange or tab 150 is also mounted on the planar blade portion 132 generally adjacent the notch 140; but positioned below an outer edge of the flange 141 of the blade end 132 which engages the spring clip 100. The flange 150 or tab includes an aperture for receiving a threaded fastener to attach an external wire or conductor to the line jaw blade 130.

FIGS. 5–8 depict the mounting of the jaw blade 130 in the socket adapter 10. The blade end 132 is inserted through the aperture 20 in one of the bosses 18 on the central wall 16 of the base 12 until the edge of the enlarged portion of the blade end 132 seats on the boss 18. The edge at one end of the enlarged portion of the blade end 132 itself prevents twisting or movement of the jaw blade 130 relative to the plane of the central wall 16 of the base 12. The edge also prevents movement of the blade end 132 through the base 12.

In addition, the angled end 136 and the outer ends of the side legs 104 and 106 of the spring clip 100 are located within the recess in the central wall 46 of the shell 14 formed by the bosses 47. This locates the jaw blade 130 vertically relative to the wall 46 of the shell 14 and prevents any upward movement of the jaw blade 130 relative to the wall 46 of the shell 14.

At the same time, as shown in FIG. 8, the slot between the side leg 106 of the spring clip 100 and the jaw contact end 142 of the jaw blade 130 are aligned with the aperture 48 in the boss 47 on the wall 46 of the shell 14 and positioned to slidingly receive a blade terminal 120 of a watthour meter or other electrical device therein. The central wall 46 and the bosses 47, meanwhile, completely cover all of the exposed, conductive portions of the jaw blade 130 and act as a dead front or safety shield for the jaw blade 130.

The jaw blade 130 may also be configured in a second embodiment with separate jaw ends and blade terminal ends. In this embodiment, by example only, the jaw blade is described as being employed as load jaw blade 64 and 66 in the watthour meter socket adapter 10.

Figure 9:
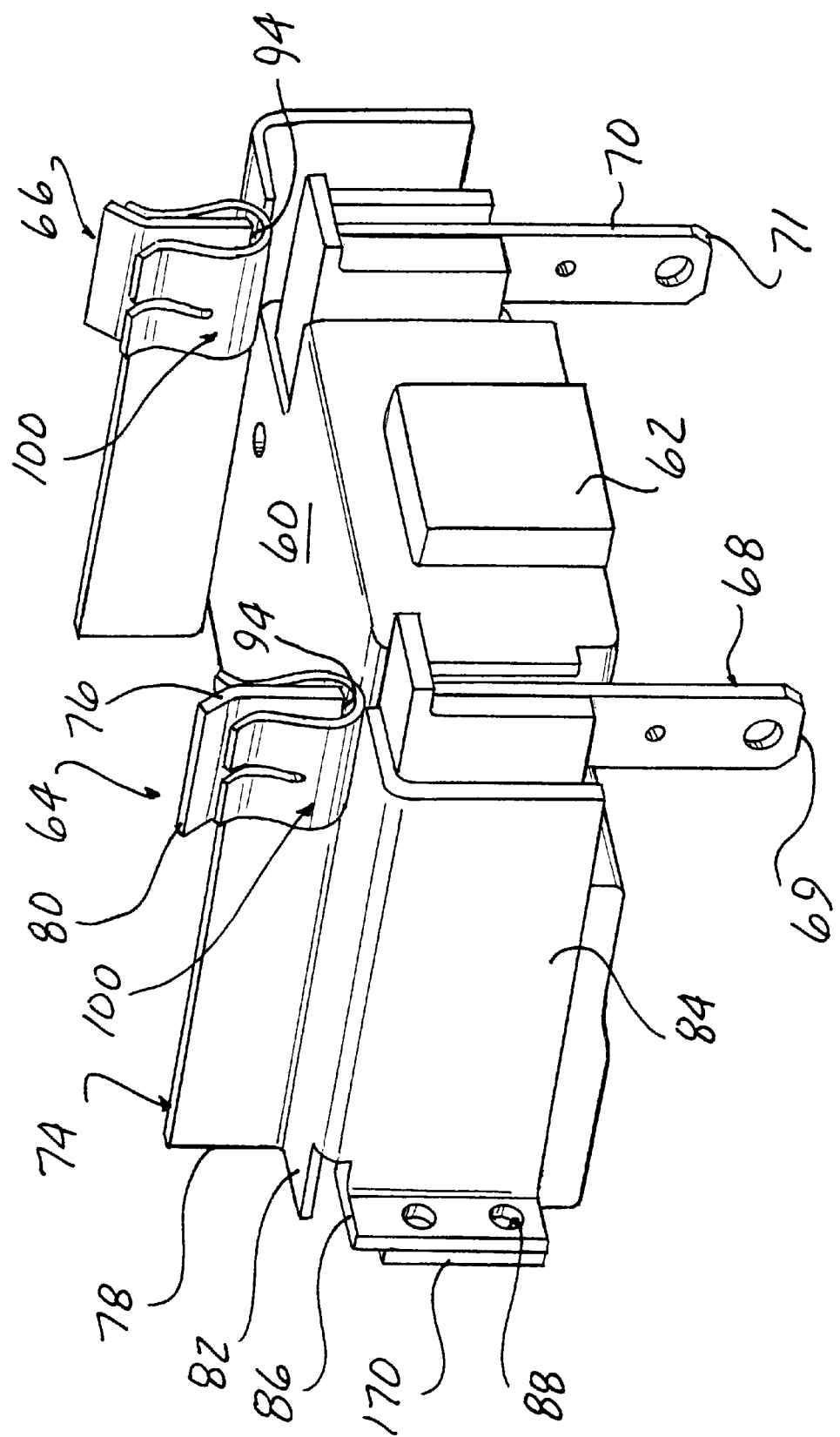
FIG. 9 is an enlarged, perspective view of the load jaw blades and the switch shown in FIGS. 1 and 2.

As shown in FIGS. 9, 10 and 11, the pair of load blade terminals 68 and 70 each comprise a generally planar member as is conventional in watthour meters and watthour meter socket adapters. One end of each load blade terminal 68 and 70 is connected to two internal bus bars within a switch as described hereafter. Outer ends 69 and 71 of the load blade terminals 68 and 70 have a length sufficient to enable the outer ends 69 and 71 to project through the bottom or central wall 16 of the base 12 exteriorly of the housing of the socket adapter 10 for insertion into mating jaw contacts in a watthour meter, not shown.

It will be understood that the following described load jaw blade structure may also alternately be employed for the line jaw blade structure or for both the line and load jaw blade structures in the socket adapter 10.

By way of example, each of a pair of load jaw blades 64 and 66, with only load jaw blade 64 being described in detail hereafter, includes a generally planar bus bar 74 which projects angularly and generally perpendicularly from the top surface of the housing of a switch 60. The planar bus bar 74 has an opposed first and second ends 76 and 78. Further, flange 80 projects angularly above and outward from the generally planar extent of the bus bar 74 to form a blade terminal guide as is conventional in watthour meter socket adapters.

A cut-out 81 is formed in each bus bar 74 to allow space for the fifth and sixth blade terminals which may be mounted on a watthour meter inserted into the socket adapter 10. In such an arrangement, the fifth and sixth terminals on the watthour meter do not contact the bus bars 74.

Further, the enlarged surface area provided by the bus bar 74, the intermediate leg 82 and the enlarged depending leg 84 form a large heat dissipation surface which enables increased load current to be carried by the load jaw blades 64 and 66.

Further, the load jaw blade 64 includes an intermediate leg 82 which projects generally perpendicularly from a bottom of the planar bus bar 74 and terminates in a depending leg 84 disposed perpendicular to the intermediate leg 82 and generally parallel to, but offset from the bus bar 74. A perpendicularly extending end flange 86 is formed to one end of the bottom leg 84 and includes at least one and preferably a pair of apertures 88 which receive fasteners to connect the flange 86 and the remainder of the one piece, integral load jaw blade 64 to a mating flange 170 on a bus bar projecting outward from the switch 60, as described above.

As shown in FIG. 10, a notch 94 is formed at one end 76 of the bus bar 74 and extends along the length of the bus bar 74 for a short length. The notch 94 is generally spaced adjacent to the intermediate leg 82.

The notch 94 is sized to receive and support a spring clip 100 identical to the spring clip 100 used with the line jaw blade 130.

The opposed load jaw blade 66 is identical to the load jaw blade 64, but is formed of a mirror image to form a pair of left and right hand jaw blades 64 and 68. However, the spring clip 100 mounted on the load jaw blade 66 is identical to the spring clip 100 used with jaw blade 64.

A remotely controlled disconnect switch 60, shown in FIGS. 1, 2, 9, 11 and 12 is located at the central wall 16 of the base 12. The disconnect switch 60 may be any commercially disconnect switch which may include an internally movable member and at least one pair of contacts which are electrically connected between one of the pair of line and load jaw blades within the socket adapter 10 and the corresponding one of the pair of line and load blade terminals projecting outwardly from the socket adapter 10 and to certain jaw contacts in a watthour meter socket, not shown. The switch 60 may be remotely actuated by means of signals provided on wires 62 which extend exteriorly of the housing of the socket adapter 10.

The remote signal wires 62 connected to the switch 60 may exit the housing of the socket adapter 10 in a variety of locations depending upon the meter application and the location of the source of the remote signals. For example, the wires 62 may exit the sidewall 2 of the shell 14 through a strain relief mounted in the sidewall 42. Optionally, the wires 62 may extend through an aperture in the central wall 16 of the base 12 for connection to a control device in a watthour meter socket. In addition, the wires 62 may exit through the an aperture of the central wall 46 of the shell 14 for connection to a control circuit in a watthour meter mounted in the socket adapter 10.

In one example, the switch 60 functions to selectively connect and disconnect the pair of load jaw blades 64 and 66 from the corresponding pair of load blade terminals 68 and 70. In this manner, an electrical power circuit through the load blade terminals in the watthour meter and to the load blade terminals is selectively controlled by means of the switch 60. For example, electrical disconnect switches, shown in U.S. Pat. No. 5,227,750 and International PCT Application No. WO95/05671, may be used as the switch 60.

As shown in FIG. 12, the switch 60 includes a housing 160 having a plurality of internally formed recesses or cavities for mounting various electrically conductive members, such as bus bars, leaf springs and a solenoid therein. A pair of first and second bus bars 162 and 164 are mounted in the housing and have an irregular shape between first and second ends 166 and 168. The first ends 166 of each of the first and second bus bars 162 and 164 are connected to a short bus bar 170 or 172 extending exteriorally of the switch housing 160 which is electrically connectable to one end of each load jaw blades 64 or 66. The second ends of each of the first and second bus bars 162 and 164 are fixedly connected to one end of first and second leaf springs 182 and 184. The opposite ends of each of the first and second leaf springs 182 and 184 carry a contact or contact pad 186 and 188 as shown in FIG. 12. The contact pads 186 and 188 form part of first and second contacts 190 and 192 with a corresponding contact pad 194 and 196 mounted on one end of the third and fourth bus bars 178 and 180.

The third and fourth bus bars 178 and 180 are also mounted in the housing 160 and have an irregularly, bent shape extending between opposite ends. The ends 200 of the third and fourth bus bars 178 and 180 are positioned in the housing 160 for electrical connection to the external load blade terminals 68 and 70.

The wires or conductors 62 are connected to a solenoid 204 which drives an extendible plunger 206. An actuator 208 is connected to and moveable with the plunger 206. The actuator 208 has a pair of engagement members 210 and 212 at opposite ends which engage the first and second leaf springs 182 and 184 respectively. In this manner, the position of the contact pads 186 and 188 on the second ends of the first and second leaf springs 182 and 184 are controlled by the engagement members 210 and 212 through directional movement of the plunger 206 upon activation and deactivation of the solenoid 204.

Since the blade terminals 68 and 70 are connected to one end of the third and fourth bus bars 178 and 180 and the load jaw blades 64 and 66 are connected to the first ends of the first and second bus bars 162 and 164, the first and second bus bars 162 and 164 are electrically connected to the third and fourth bus bars 178 and 180, respectively, thereby connecting the load jaw contacts 64 and 66 to the load blade terminals 68 and 70, respectively, when the solenoid 204 is activated to bring the first contact pads 186 and 188 of each of the first and second bus bars 162 and 164 into engagement with the second contact pads 194 and 196 carried by the third and fourth bus bars 178 and 180. Deactivation of the solenoid 204 causes the engagement members 210 and 212 to forcibly drive the first and second leaf springs 182 and 184 in a direction to separate the first contact pad 186 or 188 from the second contact pad 194 or 196 in each of the first and second contacts 190 and 192 and disconnect the load jaw contacts 64 and 66 from the load blade terminals 68 and 70. This disconnects electrical power to the load.

As shown in FIG. 13, a notch or slot 346 extends axially from a first end 342 of a conductor 340. The conductor 340 is of the type usable in a bottom connected socket adapter. The slot 346 receives a spring clip 350 in a loose, free floating connection. The spring clip 350 is formed of a spring or resilient material, such as spring steel, and has a base 352 and a pair of side legs 354 and 356 extending outward from opposite sides of the base 352. Each of the side legs 354 and 356 has a smoothly curved, arcuate shape formed of a lower portion 108 extending from the base 352. A slot 360 is formed in each side leg 354 and 356 to divide each side leg 354 and 356 into pairs of contact fingers 354*a* and 354*b* for the side leg 354, and 356*a* and 356*b* for the side leg 356. Each contact finger 354*a*, 354*b*, 356*a*, 356*b* projects outwardly from the lower portions 358 to an outer edge which curves outwardly from a contact surface on each contact finger. Contact fingers 354*a* and 356*a* have opposed contact surfaces 362 and 364 which are laterally opposed from each other as each of the contact fingers 354 and 356*a* have the same height, at least to their respective contact surfaces 362 and 364 from the base 352. Likewise, the contact fingers 354*b* and 356*b* have opposed, aligned contact surfaces 366 and 368 which are also laterally opposed from one another at the same height from the base 352. The aligned pairs of contact surfaces 362, 364 and 366, 368 may be at the same height along the longitudinal length of the spring clip 350. However, in a preferred embodiment, the height of one of the pairs of contact fingers, such as the height of the contact surfaces 366 and 368 in the pair of contact fingers 354*b* and 356*b* extend higher from the base 352 then the height of the other contact surfaces 362 and 364. This staggers the insertion force of a blade terminal into the spring clip 350 while retaining a maximum pull out force.

In use, the spring clip 350 is inserted into the slot 346 in the first end 352 of the bus bar 340. One of the side legs, such as side leg 356 will engage one side of the bus bar 340. The opposed side leg 354 will then be spaced a short distance from the bus bar 340 to define an opening for receiving a blade terminal 18 of a watthour meter 12 therein. Due to the offset height of the pairs of contact surfaces in the spring clip 350, the push-in resistance of the spring clip 350 to the insertion of a blade terminal 18 of a watthour meter 12 is staggered or divided into two steps thereby decreasing the overall push-in force required to fully insert the blade terminal 18 of a watthour meter 12 into the jaw contact 350. At the same time, the total pull-out force resistance which acts to retain the blade terminal 18 in the jaw contact 350 remains at a high level.

Referring now to FIGS. 14–21, there is depicted a socket adapter 400 constructed in accordance with the teachings of the present invention. The socket adapter 400 has a base or bottom wall 402 of generally circular shape. A plurality of apertures, such as slots 404, are formed completely through the base 402. Preferably, the apertures or slots 404 having an elongated, rectangular shape suitable for receiving the blade terminal of a jaw blade assembly as described hereafter. The slots 404 are positioned at the normal jaw contact positions of a watthour meter and watthour meter socket.

An annular ring 406 surrounds the periphery of the base 402 and forms part of a bottom wall of the socket adapter 400. An annular lip 408 projects perpendicularly from the outer edge of the ring 406 and forms the inner edge of a peripheral edge flange 410. An annular sidewall 412 projects a short distance perpendicularly from the peripheral edge flange 410. As compared to conventional socket adapter extenders, the sidewall 412 has a relatively short length or extent thereby resulting in a so-called "low profile" socket adapter 400.

The outer end of the sidewall 412 terminates in a radially outward extending mounting flange 414 which is adapted for mating with a complementary mounting flange on a watthour meter. The mounting flange 414 is surroundable by a conventional sealing ring, not shown, to sealingly join the watthour meter to the socket adapter 400 in a conventional manner.

Figure 14:
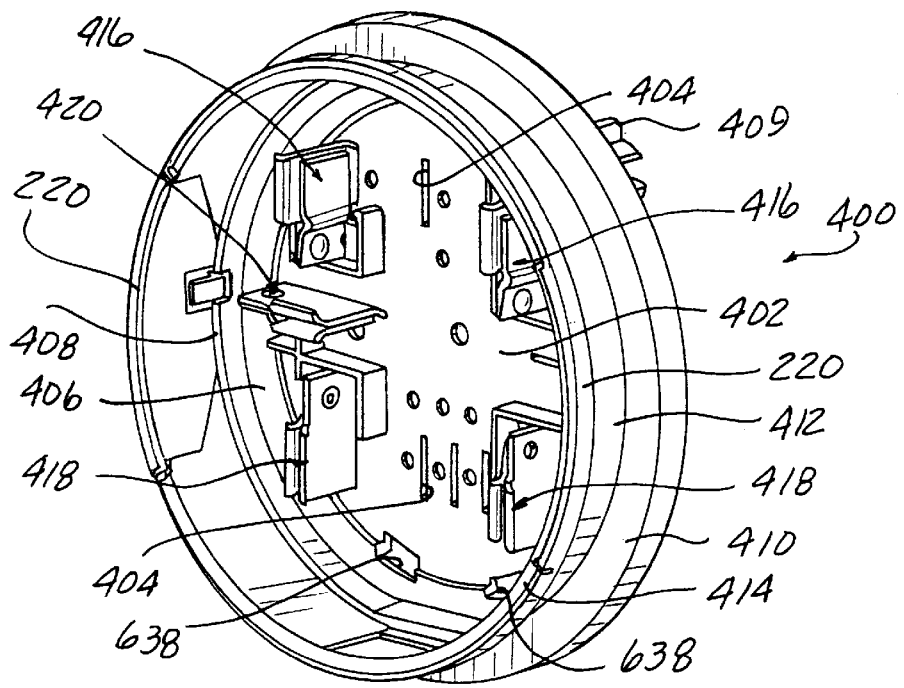
FIG. 14 is a perspective view of a watthour meter socket adapter and jaw blade apparatus according to another embodiment of the present invention.

As shown in FIG. 14, opposed pairs of notches are formed in the mounting flange 414 and receive tabs on opposite ends of a surge ground conductor 220 described above and shown in FIG. 1.

Figure 20:
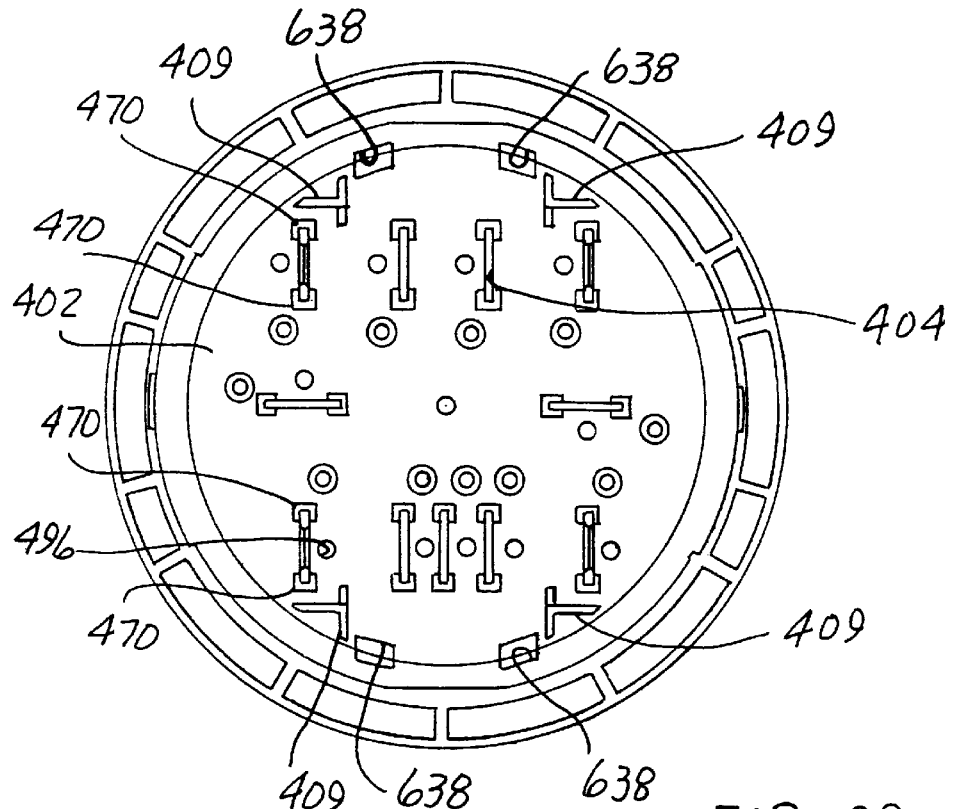
FIG. 20 is a bottom elevational view of the socket adapter housing depicted in FIG. 14.

A plurality of outwardly extending legs 409, shown more clearly in FIG. 20, are formed on a back surface of the base 402 and are provided in an appropriate number and spaced from one of the jaw blade terminals extending to the base 402 as described hereafter. The legs 409 serve as a protective means for the blade terminals.

For the single phase socket adapter 400 shown in FIG. 14, a pair of line jaw blades 416 and a pair of load jaw blades 418 are mounted in the base 402 in the appropriate jaw contact/blade terminal positions for a single phase watthour meter/watthour meter socket application. A similar jaw blade 420 may also be provided at the fifth ground contact position as shown in FIG. 14.

As each of the line, load and ground or fifth position jaw blades 416, 418 and 420 are substantially identically constructed, the following description of a first embodiment of the jaw blade 416, as shown in FIGS. 6–19, will be understood to apply equally to all line, load and ground jaw blade assemblies.

As shown in FIG. 14–19, the jaw blade 416 includes a one piece, unitary, electrically conductive bus bar 422 which is formed with a jaw end 424 and an opposed blade terminal end 426. The bus bar 422 is formed of an electrically conductive material, such as copper, or plated copper for example. An offset 428 is formed intermediately between the jaw end 424 and the blade terminal end 426 to offset the plane of the jaw end 426 from the plane of the blade terminal end 426.

An angled edge guide 430 is formed along one edge of the jaw end 424 to assist in guiding a watthour meter blade terminal, not shown, into contact with the jaw end 424 as described hereafter. An extension 432 projects unitarily from the jaw end 424 co-planarily with the jaw end 424. The extension 432 serves as a mounting base for a spring clip 434 described in greater detail hereafter. An aperture 436 is formed in the extension 432 for receiving a fastener, such as a rivet 438, used to mount the spring clip 434 on the bus bar 422.

A tab 440 projects angularly, preferably perpendicularly, from one edge of the extension 432. The tab 440 is positioned intermediate the jaw end 424 and the blade terminal end 426 of the bus bar 422 and also extends generally perpendicularly from the jaw end 424 and the blade terminal end 426. An aperture 442 may be formed in the tab 440 for receiving a fastener, not shown, to secure an auxiliary electrical conductor, not shown, to the tab 440 and jaw blade 416. However, the tab 440 serves a more important mounting function for the jaw blade assembly 416 as described hereafter.

As shown in FIG. 14–16, 18 and 19, the jaw blade 416 also includes a spring clip 450 which is formed of a spring or resilient material, such as spring steel. The spring clip 450 includes a base 452 which is connected by an intermediate, offset 454 to a contact end 456.

The base 452 is initially pre-bent from a plane parallel to the contact end 456 adjacent the offset 454, as shown in FIG. 18. An aperture 458 in the base 452 receives the fastener or rivet 438. Insertion of the rivet 438 through the aperture 458 and the corresponding aperture 436 in the extension 432 on the bus bar 422 bends the end of the base 452 into planar, full contact engagement with the extension 432 to apply spring force to the spring clip 450.

The single fastener or rivet 438 can be employed to fixedly mount the spring clip 450 on the bus bar 422 since a centering and locating dimple 458 and mating dome 460 are respectively formed in the bus bar 422 at the juncture between the extension 432 and the tab 440 and on one side edge of the base 452 of the spring clip 450. The engagement of the dimple 458 and the dome 460 locates the spring clip 450 with respect to the bus bar 422 and prevents rotation of the spring clip 450 relative to the bus bar 422 after the rivet 438 is inserted to fixedly attach the spring clip 450 to the bus bar 422.

As shown in FIGS. 16, 18 and 19, the contact end 456 of the spring clip 450 has a generally concave shape with a raised center contact surface 462 facing the adjacent jaw end 424 of the bus bar 422. Since the forced engagement of the rivet 438 with the angled base 452 of the spring clip 450 places a spring force on the spring clip 450 biasing the contact end 456 toward the adjacent jaw end 424, the raised center 462 of the contact end 456 forms an adequate contact surface with a watthour meter blade terminal inserted through a slot 464 formed between the raised center surface 462 of the spring clip 450 and the adjacent face of the jaw end 424 of the bus bar 422.

Referring now to FIGS. 14, 15, 20 and 21 there is depicted mounting means for non-rotatingly mounting each of the line and load jaw blades 416 and 418, as well as the optional ground jaw blade 420, relative to the base 402 of the socket adapter 400. The mounting means includes a plurality of irregularly shaped brackets or flanges of two types 466 and 468, by example only. The flanges 466 and 468 are unitarily formed with the base 402 and project upwardly from the base 402 within the interior space formed between the base 402 and the sidewall 412.

The flanges 466 have a generally L-shape and are positioned to engage at least two sides of the mounting tabs 440 on one line jaw blade 416 and one load jaw blade 418. The other flanges 468 have an irregular shape with one pair of perpendicularly oriented surfaces positioned to engage two edges of the tabs 440 on one line jaw blade 416 and load jaw blade 418. Other portions of the flanges 468 are positioned to engage the tabs 440 on the optional ground jaw blade 420.

In this manner, when each line and load jaw blade 416 and 418 is inserted through one of the slots 404 and the base 402, the respective tabs 440 will seat on the base 402 and engage the respective flanges 466 and 468. This aids in preventing sideways movement of each of the line and load jaw blades 416 and 418 in the respective slot 404.

FIG. 20 depicts a rear or exterior surface of the base 402. As shown in FIGS. 20 and 21, the mounting means includes at least one and preferably a pair of opposed U-shaped flanges 470 which are formed on the base 402 and disposed on opposite ends of each slot 404. Each U-shape flange 470 is positioned to engage one side edge of the blade terminal end 426 of one line or load jaw blade 416 or 418 to assist in preventing sideways pivotable movement of the jaw blade 416 or 418 in the slot 404.

The mounting means also includes at least one and preferably a plurality, such as three, by example only, of bosses 472 which are unitarily formed on the base 402 in opposed ends of each jaw blade mounting slot 404. Each boss 472 extends into the slot 404 and is adapted for engaging the blade terminal end 426 of one line or load jaw blade 416 or 418 to securely fix the blade terminal end 426 in the slot 404 without movement. The bosses 472 are arranged in pairs side edge to side edge of the slot 404 or on opposite sides of the slot 404.

Figure 22:
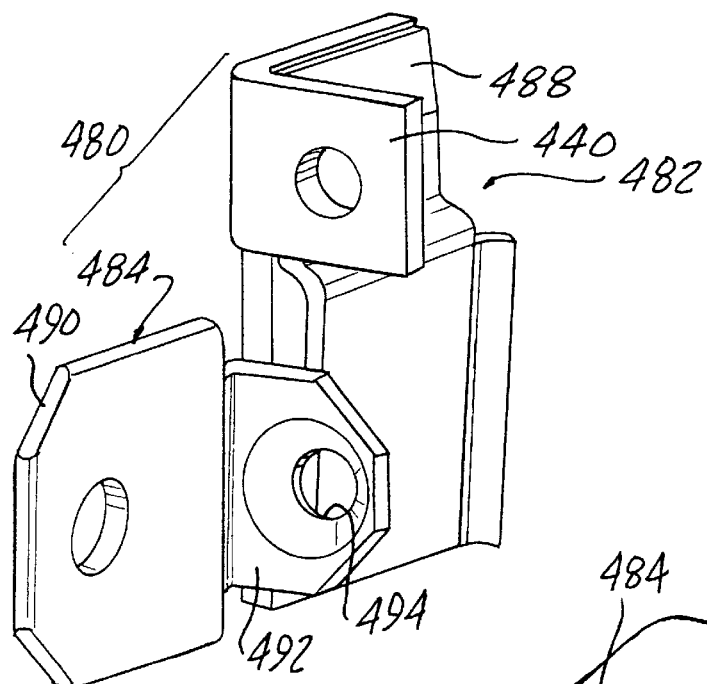
FIG. 22 is an exploded, perspective view of another embodiment of a jaw blade according to the present invention.
Figure 23:
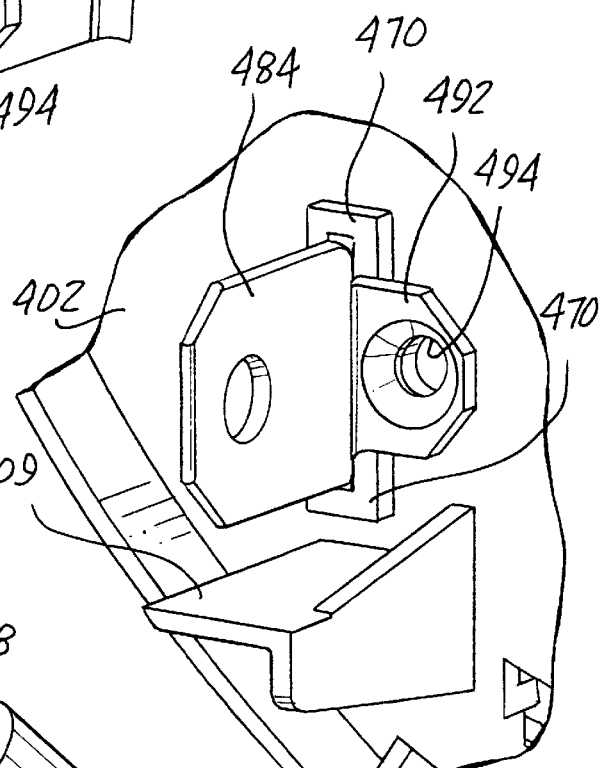
FIG. 23 is a partial, perspective view showing the mounting of the blade portion of the jaw blade depicted in FIG. 20 through the bottom wall of the socket adapter.

Referring now to FIGS. 22 and 23, there is depicted another embodiment of a jaw blade 480 which may be employed in socket adapter 400, or in any previously devised, conventional socket adapter. The jaw blade 480 is formed of a jaw contact 482 and a separate, discrete blade terminal 484. This two part arrangement of the jaw blade 480 enables the jaw blade 480 to be advantageously employed in socket adapters having an internally mounted circuit breaker or switch. The circuit breaker or switch contacts are connected across the jaw contact 482 and the blade terminal 484 of the jaw blade 480.

The jaw contact 482 is substantially identical to the jaw end 424 of the line and load jaw blades 416 and 418 described above. Specifically, the jaw contact 482 is formed of an electrically conductive material having a contact end 486 and an extension 488. Although not shown in FIG. 22, a tab projects from the extension 488 in the same manner as the tab 440 described above. A spring clip 450 is fixedly mounted to the jaw contact 482 by means of a fastener, such as a rivet, to space a contact end of the spring clip 450 from the contact surface 486 of the jaw contact 482 to define a slot therebetween for receiving a watthour meter blade terminal therein.

The blade terminal 484 is formed of a generally planar conductive member 490 and an angularly disposed or perpendicular tab 492. An aperture 494 is formed in the tab 292 for receiving a fastener to secure the blade terminal 484 in position on the base 402 to optionally attach an external electrical conductor to the blade terminal 484. The tab 494 also seats between two of the U-shaped flanges 470 on the rear surface of the base 402 to positively locate the blade terminal 484 through one slot 404 without sideways movement.

The jaw end 482 is mounted on the inside surface of the base 402 with the tab engaged with one of the flanges 466 or 468 formed on the base 402. The blade terminal 484 is likewise mounted on the rear surface of the base 402 with the tab 492 engaged between two U-shape flanges as shown in FIG. 21. Suitable apertures 496, shown in FIG. 20, may be formed in the base 402 for receiving a fastener extending through the aperture 494 on each blade terminal 490.

Figure 24:
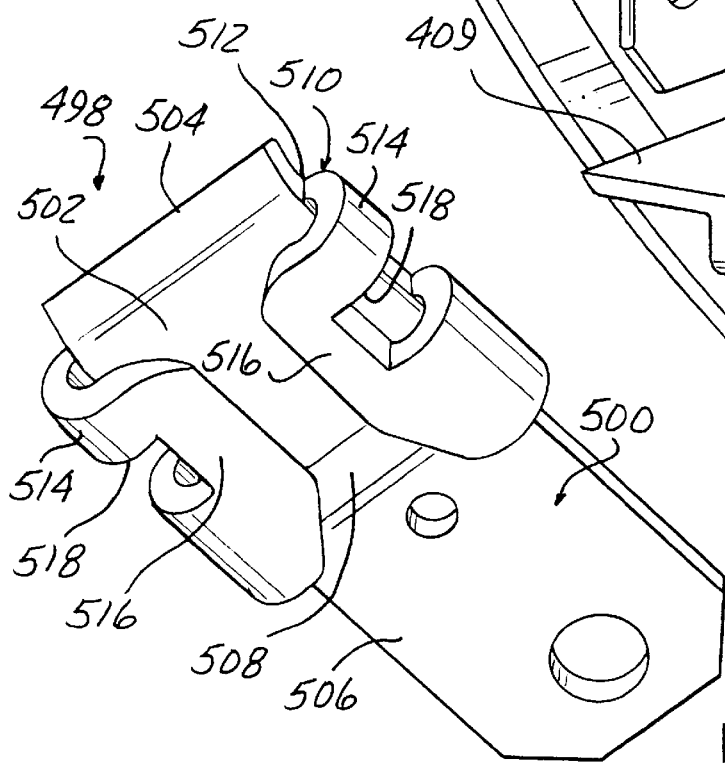
FIG. 24 is a perspective view of another embodiment of a jaw blade according to the present invention.
Figure 25:
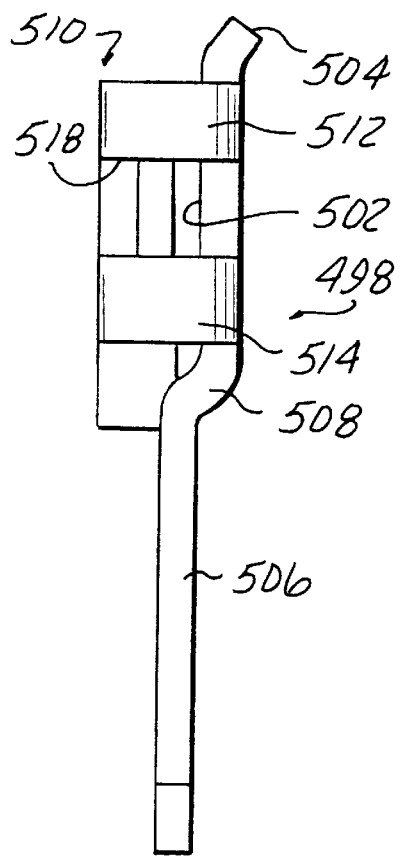
FIG. 25 is a side elevational view of the jaw blade shown in FIG. 24.

Referring now to FIGS. 24 and 25, there is depicted yet another embodiment of a jaw blade 498 which may be employed in the socket adapter 400 or any prior art socket adapter. The jaw blade 498 features a unitary, one piece construction in which the spring clip is unitarily formed as part of the bus bar portion of the jaw blade 498.

The jaw blade 498 is formed of a one piece elongated bus bar 500 of an electrically conductive material. The bus bar 500 has a jaw contact face 502 adjacent to an angled blade terminal guide 504 and an opposed blade terminal end 506 offset from the jaw contact face 502 by an intermediate offset 508.

The spring clip function of biasing a blade terminal inserted adjacent to the jaw contact face 502 into secure electrical engagement with the jaw contact face 502 is provided by at least one and preferably a pair of resilient, spring arms 510. In a preferred embodiment, a pair of spring arms 510 extend outwardly from opposite side edges of the jaw contact face 502. Each spring arm 510 has a generally U-shape extending from one end 512 unitarily formed with the jaw contact face 502 through a U-shaped intermediate curved portion 514 to an outer end 516 which is angled or bent inward toward the jaw contact face 502. The space between the second end 516 of each spring arm 510 in the adjacent jaw contact face 502 defines the slot for receiving a watthour meter blade terminal. The inward extending angle of the second end 516 of each spring arm 510 and the resilient or spring nature of each spring arm 510 provides a biasing force to urge the inserted blade terminal into secure electrical engagement with the jaw contact face 502.

The degree of resiliency or spring force provided by each spring arm 510 may be controlled or selected by means of an aperture or slot 518 which is formed in each spring arm 510 between the first end 512 and to second end 516. Making the slots 518 of longer or shorter width will vary the spring force provided by each spring arm 510.

Figure 26:
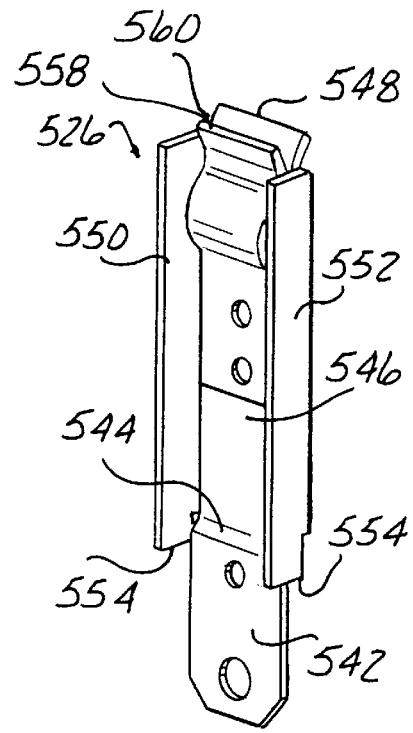
FIG. 26 is a perspective view of another embodiment of a jaw blade according to the present invention.
Figure 27:
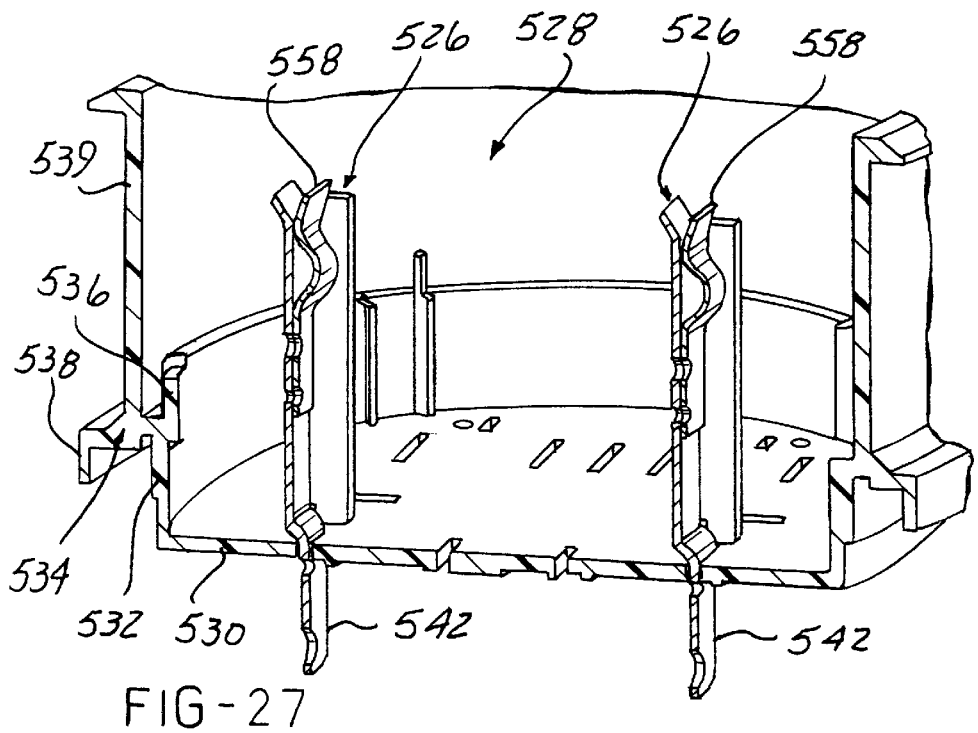
FIG. 27 is a partially cross sectioned, perspective view showing the mounting of the jaw blade depicted in FIG. 26 in a watthour meter socket adapter extender housing constructed according to the present invention.

Referring now to FIGS. 26 and 27, there is depicted yet another embodiment of a jaw blade 526. The jaw blade 526 has an elongated shape as compared to the jaw blades 416 and 418 described above and is particularly suited for use in a socket adapter extender 528 shown in FIG. 27. The socket adapter extender 528 is similar to the socket adapter 400 described above with several modifications. The housing of the socket adapter extender 528 includes a generally planar base or bottom wall 530 and lower sidewall 532. The sidewall 532 terminates at a radially outward extending mounting flange 534. The mounting flange 534 has an inward extending, annular shelf 536 disposed interiorally within the socket adapter extender 528 and an outwardly extending flange terminating in a depending lip 538 spaced from the lower sidewall 532. The lip 538 is positioned for receiving a sealing ring to mount the socket adapter extender 528 on a ring-style socket adapter cover, not shown. An upper sidewall 439 extends from the mounting flange 534 and terminates in a mounting flange.

The jaw blade 526 has a unitary, one piece construction formed of a blade terminal end 542 which is offset by an intermediate offset 444 from an elongated jaw contact end 546. A blade terminal edge guide 548 is formed at one end of the jaw contact end 546.

A pair of side flanges 550 and 552 project perpendicularly from opposite side edges of the jaw contact end 546 and extend from an upper end adjacent the blade terminal guide 548 and to an opposite end 554 approximate the intermediate offset 544. The second end 554 of each side flange 550 and 552 seats on the base 530 of the socket adapter extender 528 to prevent sideways movement of the jaw blade 526 relative to the base 530.

A conventional spring clip 558 is fixedly connected to the jaw contact end 546 by two fasteners, such as rivets, not shown, extendible through the apertures 559. The upper end of the spring clip 558 angles outwardly to form a mating blade terminal guide 548 on the jaw contact end 546. The end 560 of the spring clip 558 is spaced from the adjacent jaw contact end 546 to define a slot for receiving a watthour meter blade terminal in a conventional manner.

Figure 28:
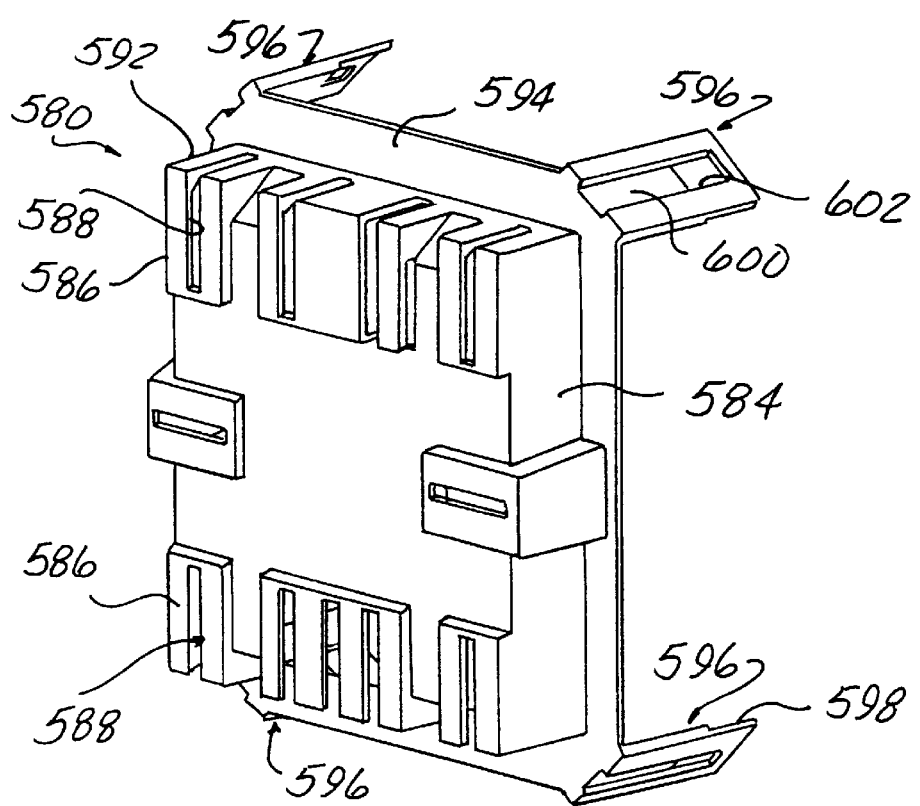
FIG. 28 is a perspective view of a first embodiment of a jaw contact safety shield according to the present invention.
Figure 29:
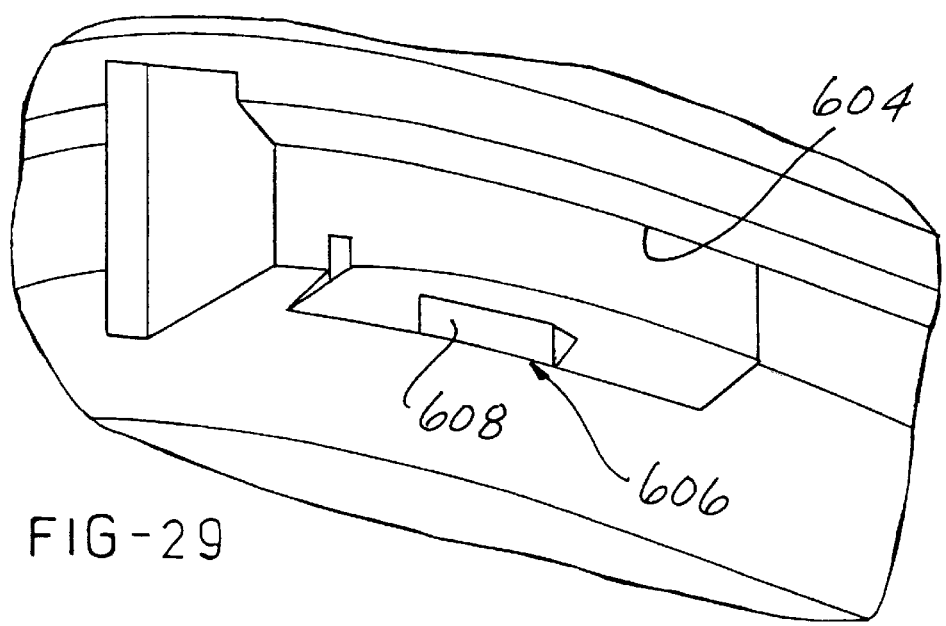
FIG. 29 is an enlarged, partial, perspective view showing the jaw contact safety shield mounting aperture and latch projection.
Figure 30:
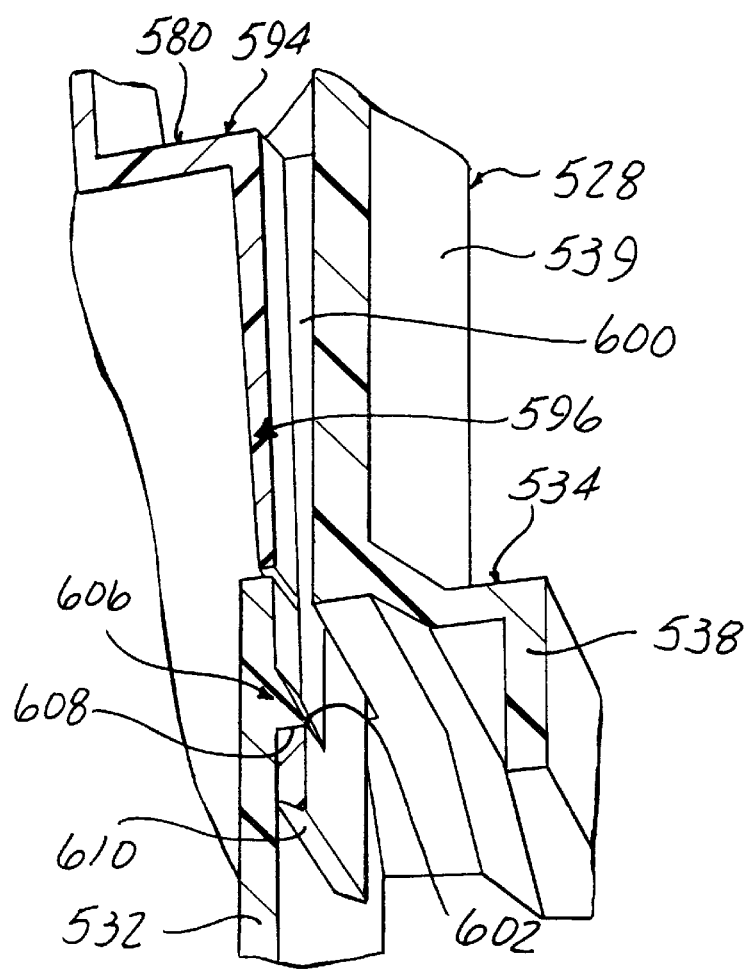
FIG. 30 is an enlarged, partial, perspective view showing the interlocking of the safety shield with the latch projection shown in FIG. 29.

Referring now to FIGS. 28–30, there is depicted a jaw contact safety shield 580 which is mountable in the socket adapter extender 528. The safety shield 580 is formed of a one piece electrically insulating material, such as a suitable plastic, and is formed of an enclosure which, when the safety shield 580 is mounted in the socket adapter extender 528, completely surrounds all of the line and load jaw blades within the socket adapter extender 528 except for small slots allowing the insertion of a watthour blade terminal into engagement with each line and load jaw blade.

The safety shield 580 includes a top or outer wall 582 and a plurality of sidewalls all denoted by reference number 584. A plurality of raised bosses 586 are formed in the top wall 582. The bosses 586 are positioned at the normal jaw contact positions of a watthour meter socket adapter.

Each boss 586 has an aperture or slot 588 formed therein. Each slot 588 has a top wall portion 590 extending parallel to the plane of the top wall 582 and a contiguous sidewall portion 592 forming a continuous L-shaped slot along the top wall 582 and the sidewall 584 of the safety shield 580. The unique provision of the side slot portion 592 simplifies the insertion and removal of a watthour meter into and out of the jaw contacts of the socket adapter extender 528 through the safety shield 580.

A peripheral flange 594 extends outward from a lower edge of the sidewall 584 of the safety shield 580. The peripheral flange 594 has a polygonal or square shape, by example only. Other shapes, such as octagonal, round, etc., may also be employed.

A plurality of legs 596 project from the peripheral flange 594, generally at each corner of the peripheral flange 594. Each leg 596 has a generally planar configuration with a notched inner surface 598. A slot 600 is formed on the outer side of each leg 596 extending from the peripheral flange 594 to an aperture 602 in each leg 596.

Latch means is provided for releasibly latching each leg 596 and the entire safety shield 580 in the socket adapter extender 528. The latch means includes a plurality of apertures 604 formed in the lower sidewall 632 of the extender 528 adjacent to the mounting flange 534 as shown in FIG. 30. A latch projection 606 is unitarily formed with the sidewall 532 and projects outwardly therefrom. The latch projection 606 has a flat edge surface 608 for releasible engagement with the aperture 602 in each leg 596 as shown in FIG. 30. As the legs 596 of the safety shield 580 are urged toward each latch projection 606, the outer end of each leg 596, which has an angled end surface 610, rides along the latch projection 606 until the aperture 602 slides over the edge 608 of the latch projection 606 releasibly latching the leg 596 to the housing of the extender socket adapter 528. Since the aperture 604 in the sidewall 532 opens outwardly underneath the mounting flange 534, the legs 596 of the safety shield 580 may be released from the latch projection 606 by forcing a tool, such as a screwdriver, underneath the lower end of each leg 596 disengaging the leg 596 from the latch projection 606.

Figure 31:
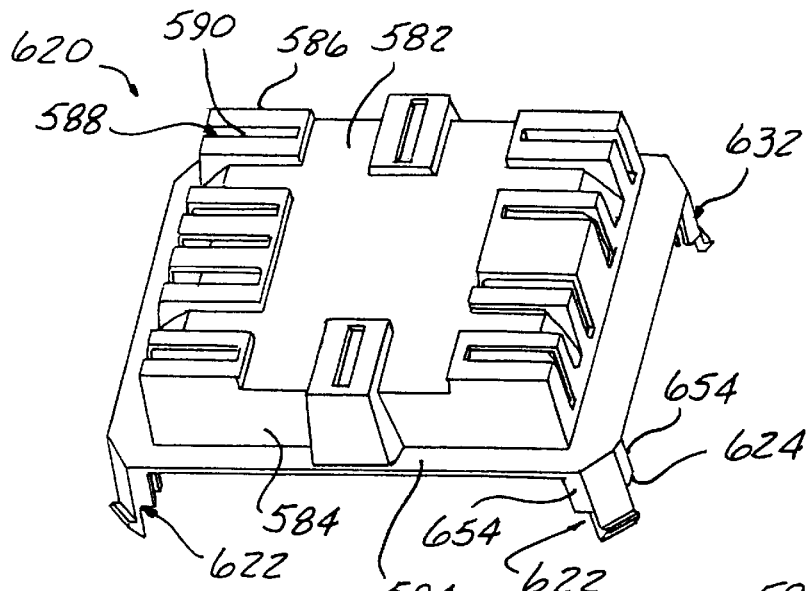
FIG. 31 is a perspective view of yet another embodiment of a jaw contact safety shield according to present invention.
Figure 32:
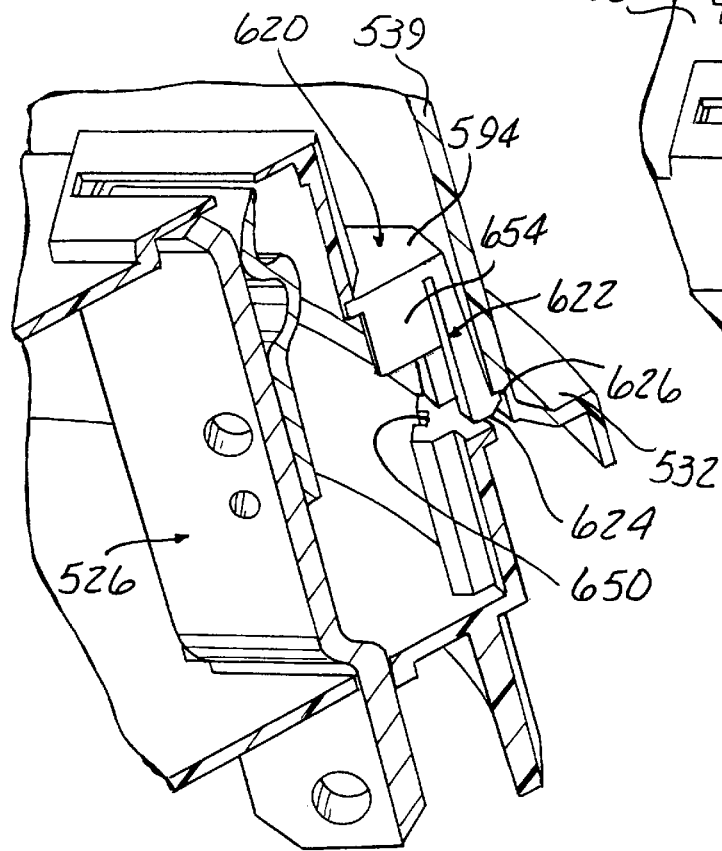
FIG. 32 is a partial, enlarged, perspective view showing the interlocking of the jaw contact shield of FIG. 31 with the socket adapter housing depicted in FIG. 27.

A modified safety shield 620, which is substantially similar to the safety shield 580 shown in FIG. 28 is depicted in FIGS. 31 and 32. Accordingly, like reference numbers are used to identify like components in both of the safety shields 580 and 620.

In this embodiment, the plurality of legs 622 are also located at the outer corners of the safety shield 620. Each leg 622 terminates in an outwardly extending latch projection 624 which is positioned to engage an inner lip 626 formed in the sidewall 539 adjacent the mounting flange 532 as shown in FIG. 32 to releasibly latch the safety shield 620 to the housing of the socket adapter extender 528. The latch projection 624 is accessible from the bottom of the mounting 532 and can be urged radially inward from the mounting flange 532 to disengage the latch projection 624 from the lip 626 and enable the safety shield 620 to be removed from the extender 528.

Figure 15:
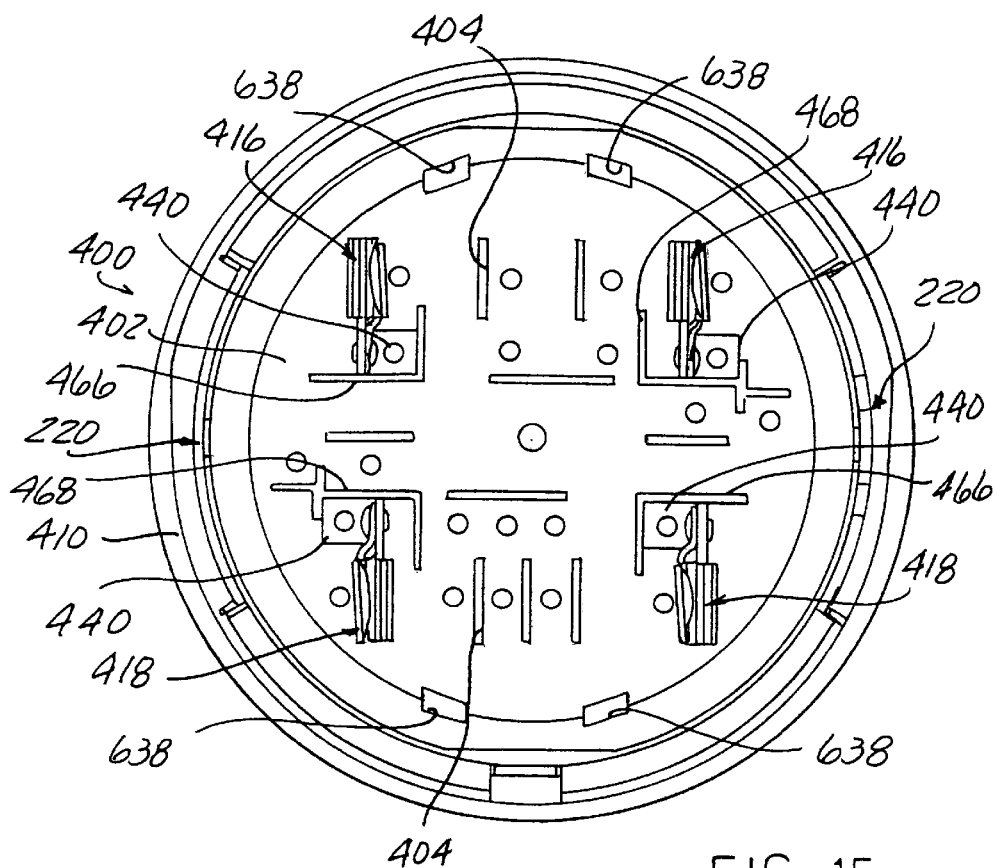
FIG. 15 is a front elevational view of the watthour meter socket adapter and jaw blades shown in FIG. 14.
Figure 33:
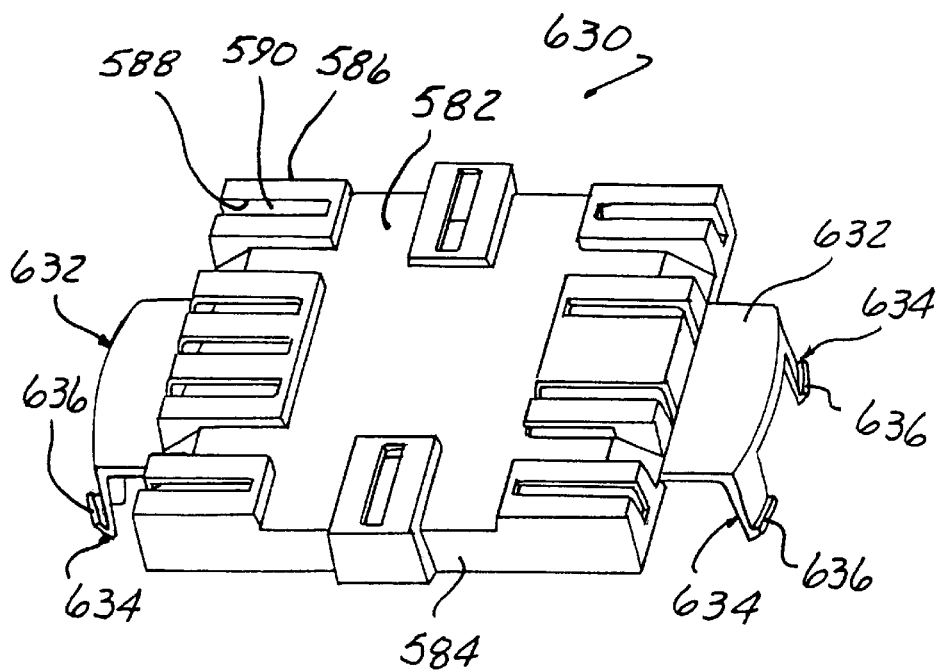
FIG. 33 is a perspective view of another embodiment of a jaw contact safety shield according to the present invention.
Figure 34:
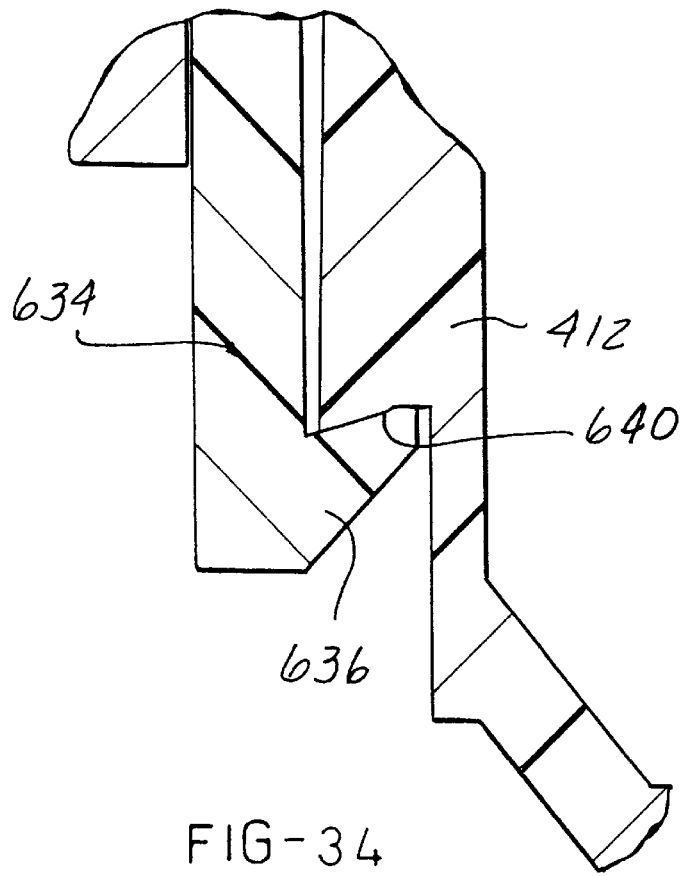
FIG. 34 is a partial, enlarged, perspective view showing the interlocking of the jaw contact shield of FIG. 33 in the socket adapter depicted in FIG. 27.

Referring now to FIGS. 33 and 34, there is depicted another embodiment of a jaw contact safety shield 630 which is particularly suited for use with the low profile socket adapter 40 shown in FIG. 14. Again, since the safety shield 630 is similar to the safety shields 580 and 620 described above, like components are depicted by the same reference number. In this embodiment, a pair of spaced end flanges 632 are formed on opposite portions of the sidewalls 584 and project outwardly from the adjacent sidewall 584. Each end flange 632 has a pair of downwardly depending legs 634 extending therefrom, each leg 634 terminating in an outwardly extending latch projection 636. The latch projection 636 on each leg 634 in releasibly insertable through one aperture 638 in the base 402 and the adjacent ring 406 of the socket adapter 400 housing as shown in FIGS. 14 and 15.

As shown in detail in FIG. 34, each latch projection 636 snaps into engagement with an underlying surface 640 on the sidewall of the socket adapter housing to releasibly mount the safety shield 630 to the housing. Each latch projection 636 may be released from engagement with the back surface of the base 402 by means of a sharp tool inserted from behind the base 402.

Figure 35:
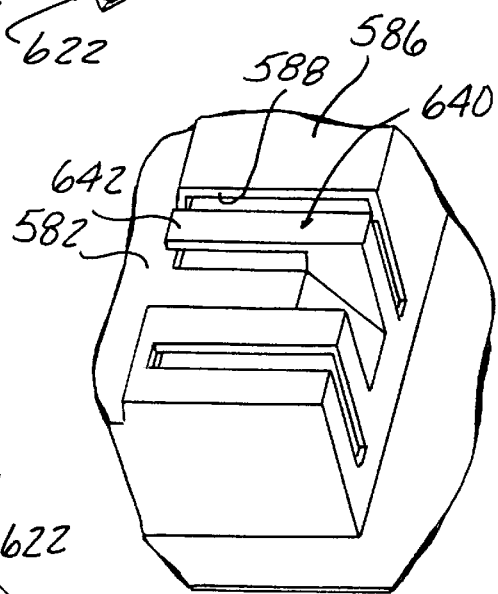
FIG. 35 is an enlarged, partial, perspective view showing a feature of the jaw contact shield shown in FIGS. 28, 31 and 33.

Turning now to FIGS. 33 and 35, there is depicted a unique feature of the safety shields 630, 580 and 620. As shown therein, one leg 640 of the boss 586 adjacent to the slot 588 positioned at the eighth jaw contact position is cantilevered from an outer edge adjacent the sidewall 584. This provides the cantilevered flange 640 with a freely movable end 642 which enables the flange 640 to bend inward about the outer edge in a watthour application where a single phase watthour meter has a potential clip at this position. The potential clip engages the flange 640 and bends it inward about the outer end enabling the watthour meter to properly seat in the socket adapter.

Referring now to FIG. 36, there is depicted a modification to the socket adapter 400 which provides the socket adapter 400 with means for mounting auxiliary components, such as generally planar circuit boards 653, adjacent to or preferably on the base 402. The mounting means comprises at least one pair and, preferably, a plurality of pairs of posts 650 which are arranged in diametrically opposed pairs. Each post 650 is formed at the juncture of the base 402 and the ring 406 of the socket adapter 400 and extends upward therefrom. A U-shaped channel 652 is formed in each post 650. The U-shaped channel 652 in one post is linearly aligned with a U-shaped channel of a post 650 in one adjacent pair of posts 650 as shown in FIG. 36. This arrangement forms a pair of channels 652 adjacent to the inner surface of the sidewall 412 of the socket adapter 400.

Although the peripheral flange 594 of the shield 620 may be cut out or shortened to allow the circuit boards 653 mounted within the pairs of posts 650 to extend upward along side of the sidewall 592 of the shield 620, in a preferred embodiment, as shown in FIGS. 31 and 32, a U-shaped slot 654, one wall of which is shown in FIGS. 31 and 32, is integrally formed adjacent to opposite side edges of each leg 622 of the shield 620 and engage the upper end of a circuit board 653 disposed adjacent to each slot 654. In this manner, the circuit board 653 mounted in the channels 650 and slots 654 and seated against the peripheral flange 594 of the shield 620.

Also shown in FIG. 36 is further modification to the socket adapter 400, or more preferably, the socket adapter 528, in which at least four and preferably more standoffs 656 are mounted on the base 402 of the socket adapter 400 for securing a circuit board, not shown, in a horizontal orientation between the line and load jaw blades 416 and 418. Screws are insertable through apertures into the circuit board into the stand offs 656.

Figure 37:
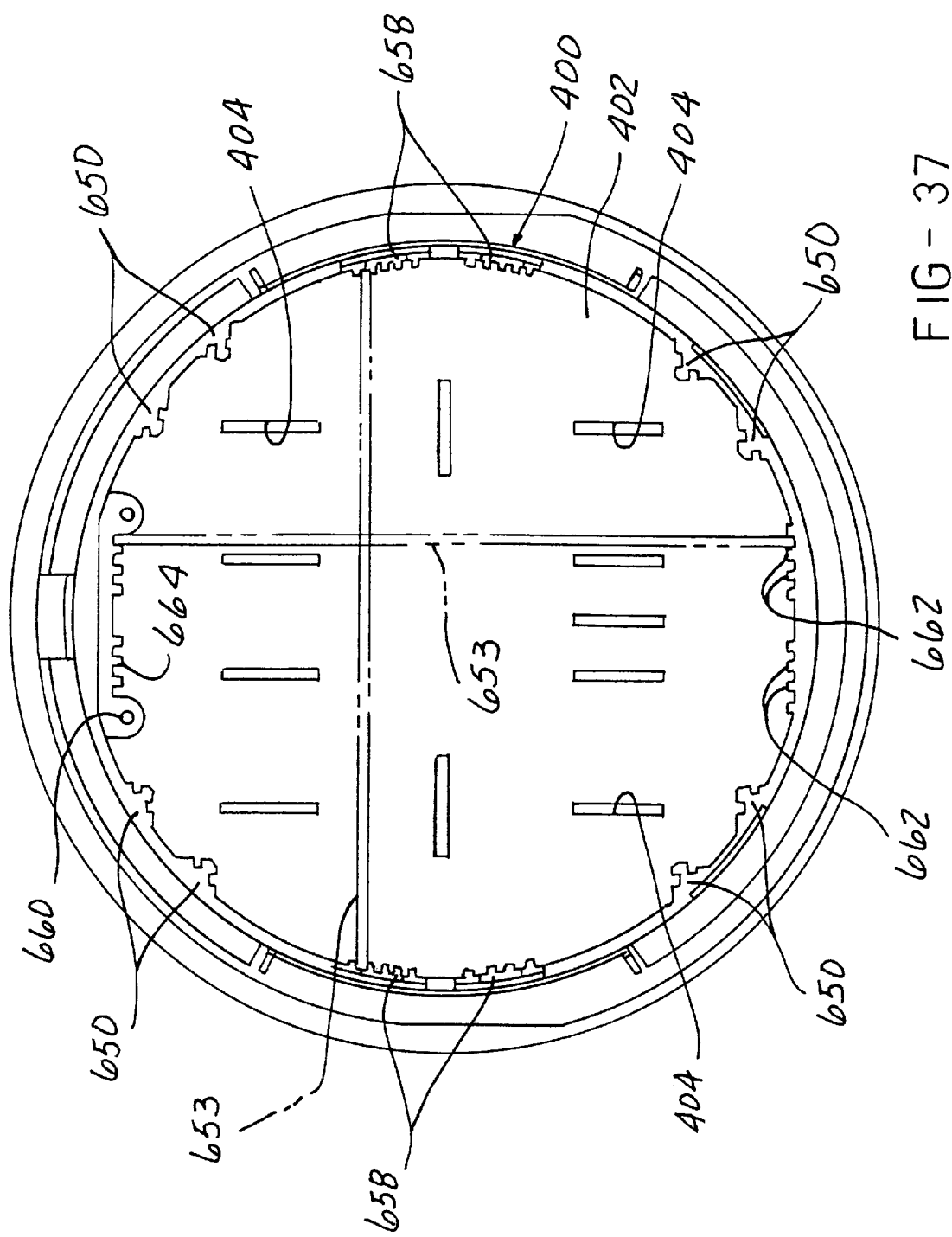
FIG. 37 is a front elevational view of a watthour meter socket adapter housing according to the present invention with circuit board mounting means.

FIG. 37 shows a further modification to the socket adapter 400 in which the socket adapter 400 is devised for carrying one or more circuit boards 563 at various positions within the sidewall 412. Although FIG. 37 depicts the pairs of posts 650 generally arranged in two diametrically opposed pairs, it will be understood that the embodiment shown in FIG. 37 need not necessarily include such posts 650.

Auxiliary support members 658, 660 and 662 are provided at various locations about the periphery of the sidewall 412 at the juncture of the sidewall 412 and the base 402. The auxiliary support members may take a variety of forms as shown by the different support members 658, 660 and 662. The support members 658, 660 and 662 all include at least one or more U-shaped slots 664. The support members 658, 660 and 662 are arranged in opposed pairs, as shown in FIG. 37, by example only, such that one slot in one support member linearly aligns with one slot in an opposed support member. The pairs of aligned slots are thus capable of supporting opposite edges of a circuit board 653 oriented perpendicularly with respect to the base 402 of the socket adapter 400. This enables many circuit boards 653 to be housed within the socket adapter 400 between the jaw contact ends of the line and load jaw blades 416 and 418. The support members 658, 660 and 662 may also be provided outside of the shield 620 to support a circuit board between the sidewall 412 and the sidewall 594 or the shield 620

In summary, there has been disclosed unique jaw blade assemblies which simplify the manufacture and reduce the cost of a watthour meter socket adapter while at the same time meeting the required current carrying capabilities of jaw blades used in watthour meter socket adapters. Further, the housing of the socket adapter is provided as a one piece assembly with a base and an annular sidewall projecting from the base. Unique mounting means are provided for non-movably mounting the jaw blade terminals in slots in the base. Circuit board support members are disposed in the housing of the socket adapter for supporting circuit boards in positions adjacent to the jaw blade terminals.

What is claimed is:

1. A watthour meter socket adapter for releasably interconnecting blade terminals of a watthour meter into jaw contacts in a watthour meter socket, the socket adapter comprising:
    a housing having a base wall and an annular sidewall extending from the base;
    a plurality of apertures formed in the base wall for receiving individual jaw blades therethrough; and
    at least one jaw blade mounted in one of the apertures, the at least one jaw blade including:
        a jaw contact portion having a single planar contact surface disposed within the housing and a blade terminal portion extending through the aperture in the base wall for insertion into a jaw contact of a watthour meter socket;
        a aperture formed in the jaw contact portion; and
        a spring clip slidably mounted in the aperture in the jaw contact portion, the spring clip having first and second resilient side legs, with the first side leg spacable from the planar contact surface of the jaw contact portion to define an opening with the contact surface for receiving a watthour meter blade terminal therebetween the second side leg disposable in contact with the jaw contact portion.

2. The socket adapter of claim 1 wherein the spring clip further comprises:
    a base connecting the first and second side legs; and
    at least a slot formed in each of the first and second side legs and dividing each of the first and second legs into at least two discrete contact fingers.

3. The socket adapter of claim 2 wherein:
    one contact finger of each of the first and second side legs aligned with one contact finger of the opposed one of the first and second side legs and forming two pairs of contact fingers.

4. The socket adapter of claim 3 wherein the height of the contact fingers in one pair of contact fingers with respect to the base of the spring clip differs from the height of the contact fingers in the adjacent pair of contact fingers.

5. A watthour meter socket adapter for releasably interconnecting blade terminals of a watthour meter into jaw contacts in a watthour meter socket, the socket adapter comprising:
    a housing having a base wall and an annular side wall extending from the base;
    a plurality of apertures formed in the base wall for receiving individual jaw blades therethrough; and
    at least one jaw blade mounted in one of the apertures, the at least one jaw blade including:
        a jaw contact portion disposed within the housing and a blade terminal portion extending through the aperture in the base wall for insertion into a jaw contact of a watthour meter socket;
        the jaw contact portion and the blade terminal portion being disposed on opposite ends of an elongated one piece unitary electrically conductive member; and
        a spring clip joined to the jaw contact portion, the spring clip including:
        a first end and a second end, the second end being angled with respect to a plane through the first end;
        a single fastener insertable through the second end acting to urge the second end into co-planar alignment with the jaw contact portion such that the first end is disposed angularly with respect to the jaw contact portion to cause the first end to apply a spring force to a blade inserted between the jaw contact portion and the first end.

6. The socket adapter of claim 5 wherein the spring clip further comprises:
    a unitary member having first and second ends, the first end having a raised center extending from a plane containing outer side edges of the first end, the raised center facing the jaw contact portion of the jaw blade when the spring clip is mounted on the jaw blade.

7. The socket adapter of claim 5 wherein:
    an axis through the first and second end of the spring clip is disposed transverse to an axis through the jaw contact portion and the blade terminal portion of the jaw blade.

8. A watthour meter socket adapter for releasably interconnecting blade terminals of a watthour meter into jaw contacts in a watthour meter socket, the socket adapter comprising:

a housing having a base wall and an annular side wall extending from the base;

a plurality of apertures formed in the base wall for receiving individual jaw blades therethrough; and at least one jaw blade mounted in one of the apertures the at least one jaw blade including:

a separate jaw contact portion disposed within the housing and a separate blade terminal portion extending through the aperture in the base wall for insertion into a jaw contact of a watthour meter socket;

a spring clip joined to the jaw portion; and means, unitary with the jaw contact portion and the blade terminal portion, for separately supporting the jaw contact portion and the blade terminal portion respectively on the base.

9. A watthour meter socket adapter for releasably interconnecting blade terminals of a watthour meter into jaw contacts in a watthour meter socket, the socket adapter comprising:

a housing having a base wall and an annular side wall extending from the base;

a plurality of apertures formed in the base wall for receiving individual jaw blades therethrough; and at least one jaw blade mounted in one of the apertures, the at least one jaw blade including:

a separate jaw contact portion disposed within the housing and a separate blade portion extending through the aperture in the base wall for insertion into a jaw contact of a watthour meter socket;

a spring clip joined to the jaw contact portion; and means unitary with the jaw contact portion and the blade terminal portion, for separately supporting the jaw contact portion and the blade terminal portion respectively on the base, the supporting means including:

a tab unitarily formed on the jaw contact portion; and a tab unitarily formed on the blade terminal portion.

10. The socket adapter of claim 9 further comprising:

at least one aperture formed in the base wall;

a fastener extendable through the aperture and a mating aperture in a tab of one of the jaw contact portion portion and the blade terminal portion for fixedly securing one of the jaw contact portion and the blade terminal portion to the base wall.

11. A watthour meter socket adapter for releasably interconnecting blade terminals of a watthour meter into jaw contacts in a watthour meter socket, the socket adapter comprising:

a housing having a base wall and an annular side wall extending from the base;

a plurality of apertures formed in the base wall for receiving individual jaw blades therethrough; and at least one jaw blade mounted in one of the apertures, the at least one jaw blade including:

a jaw contact portion disposed within the housing and a blade portion terminal extending through the aperture in the base wall for insertion into a jaw contact of a watthour meter socket;

a spring clip joined to the jaw portion;

means, unitary with the jaw contact portion, for supporting the jaw contact portion on the base wall, the supporting means including a tab unitarily projecting from the jaw contact portion.

12. The socket adapter of claim 11 wherein the tab projects substantially perpendicularly from the jaw contact portion.

13. The watthour meter socket adapter for releasably interconnecting blade terminals of a watthour meter into jaw contacts in a watthour meter socket, the socket adapter comprising:

a housing having a base wall and an annular side wall extending from the base;

a plurality of apertures formed in the base wall for receiving individual jaw blades therethrough; and at least one jaw blade mounted in one of the apertures, the at least one jaw blade including:

a jaw contact portion disposed within the housing and a blade portion terminal extending through the aperture in the base wall for insertion into a jaw contact of a watthour meter socket;

a spring clip joined to the jaw portion;

means, unitary with the jaw contact portion, for supporting the jaw contact portion on the base wall, the supporting means including:

a tab unitarily projecting from the jaw contact portion; and a plurality of flange members carried on the base wall and engaging the tab for non-movably supporting the tab on the base.

14. The socket adapter of claim 11 wherein:

the tab is adapted to fixedly receive an external electrical conductor.

15. A watthour meter socket adapter for releasably interconnecting blade terminals of a watthour meter into jaw contacts in a watthour meter socket the socket adapter comprising:

a housing having a base wall and an annular side wall extending from the base;

a plurality of apertures formed in the base wall for receiving individual jaw blades therethrough; and at least one jaw blade mounted in one of the apertures the at least one jaw blade including:

a jaw contact portion disposed within the housing and a blade terminal portion extending through the aperture in the base wall for insertion into a jaw contact of a watthour meter socket;

a spring clip joined to the jaw contact portion;

a single mechanical fastener fixedly joining the spring clip to the jaw contact portion;

mating, complementarity formed projection and recess formed on the spring clip and the jaw contact portion for non-movably fixing the spring clip with respect to the jaw contact portion.

16. A watthour meter socket adapter for releasably interconnecting blade terminals of a watthour meter into jaw contacts in a watthour meter socket, the socket adapter comprising:

a housing having a base wall and an annular side wall extending from the base;

a plurality of apertures formed in the base wall for receiving individual jaw blades therethrough; and at least one jaw blade mounted in one of the apertures the at least one jaw blade including:

a jaw contact portion disposed within the housing and a blade terminal portion extending through the aperture in the base wall for insertion into a jaw contact of a watthour meter socket;

a spring clip joined to the jaw contact portion;

means for non-movably mounting the jaw blade on the base, the mounting means including;

at least a pair of projections formed on the base wall and extending into the aperture in the base wall, the pair of projections engaging the blade terminal portion of the jaw blade for non-movably supporting the blade terminal portion in the aperture.

17. The socket adapter of claim 16 wherein the mounting means further comprises:

two pairs of projections extending into opposite ends of the aperture for engaging opposite ends of the blade terminal portion.

18. A watthour meter socket adapter for releasably interconnecting blade terminals of a watthour meter into jaw contacts in a watthour meter socket the socket adapter comprising: housing having a base wall and an annular side wall extending from the base;

a plurality of apertures formed in the base wall for receiving individual jaw blades therethrough;

at least one jaw blade mounted in one of the apertures the at least one jaw blade including:
a jaw contact portion disposed within the housing and a blade terminal portion extending through the aperture in the base wall for insertion into a jaw contact of a watthour meter socket; and
a spring clip joined to the jaw contact portion; and
means for non-movably supporting the jaw blade with respect to the base, the mounting means including a pair of ribs projecting from the base and positioned to engage opposite sides of the blade terminal portion of the jaw blade.

19. The socket adapter of claim 18 wherein the mounting means further comprises:

means for non-movably mounting the jaw blade on the base, the mounting means including;
at least a pair of projections formed on the base wall and extending into the aperture in the base wall, the pair of projections engaging the blade terminal portion of the jaw blade for non-movably supporting the blade terminal portion in the aperture.

20. The socket adapter of claim 19 wherein the mounting means further comprises:

a tab unitarily projecting from the jaw contact portion.

21. A watthour meter socket adapter for releasably interconnecting blade terminals of a watthour meter into jaw contacts in a watthour meter socket, the socket adapter comprising:

a housing having a single base wall and an annular sidewall unitarily formed with the base and extending from the base;

a plurality of apertures formed in the base wall for receiving individual jaw blades therethrough;

at least one jaw blade mounted in one of the apertures, the at least one jaw blade including:
a jaw contact portion disposed within the housing and a blade terminal portion extending through the aperture in the base wall for insertion into a jaw contact of a watthour meter socket,
a spring clip engaged with the jaw contact portion to form a blade terminal jaw;
a tab projecting angularly from the jaw contact portion for engagement with the base wall to non-movably support the jaw contact portion relative to the base wall; and
a fastener extending through the tab and the base wall to non-movably fix the tab to the base wall.

22. A watthour meter socket adapter for releasably interconnecting blade terminals of a watthour meter into jaw contacts in a watthour meter socket the socket adapter comprising:

a housing having a single base wall and an annular side wall unitarily formed with the base and extending from the base;

a plurality of apertures formed in the base wall for receiving individual jaw blades therethrough;

at least one jaw blade mounted in one of the apertures the at least one jaw blade including:
a jaw contact portion disposed within the housing and a blade terminal portion extending through the aperture in the base wall for insertion into a jaw contact of a watthour meter socket;
a spring clip engaged with the jaw contact portion to form a blade terminal jaw the spring clip having first and second opposed ends, the first end spaced from the jaw contact portion to define the blade terminal jaw therebetween;
the second end being angled with respect to a plane through the first end;
the second end bendable to a planar form with the jaw contact portion to apply a spring force to the first end; and
a tab projecting angularly from the jaw contact portion for engagement with the base wall to non-movably support the jaw contact portion relative to the base.

23. The socket adapter of claim 22 wherein the first end has a raised center contact surface projecting from a plane extending between two opposed side edges of the first end of the spring clip.

24. The socket adapter of claim 22 wherein the first and second ends of the spring clip extend substantially perpendicularly between opposed ends of the jaw contact portion.

25. The socket adapter of claim 24 wherein the jaw blade comprises a one piece unitary member.

26. The socket adapter of claim 25 wherein the jaw contact portion is longitudinally offset from the blade portion.

27. The socket adapter of claim 25 wherein:

the tab extends perpendicularly from a major plane of the jaw contact portion.

28. The socket adapter of claim 27 further comprising:

means for non-movably supporting the jaw contact portion relative to the base wall when the jaw contact portion is mounted to the aperture in the base wall, the supporting means including:
a projection extending from the base wall into engagement with the tab.

29. The socket adapter of claim 21 wherein the jaw contact portion and the blade terminal portion are discrete members.

30. The socket adapter of claim 29 further comprising:

a tab projecting angularly from each of the jaw contact portion and the blade terminal portion.

31. A watthour meter socket adapter for releasably interconnecting blade terminals of a watthour meter into jaw contacts in a watthour meter socket, the socket adapter comprising:

a housing having a single base wall and an annular side wall unitarily formed with the base and extending from the base;

a plurality of apertures formed in the base wall for receiving individual jaw blades therethrough;

at least one jaw blade mounted in one of the apertures the at least one jaw blade including:
a jaw contact portion disposed within the housing and a blade terminal portion extending through the aperture in the base wall for insertion into a jaw contact of a watthour meter socket, a spring clip engaged with the jaw contact portion to form a blade terminal jaw;

a tab projecting angularly from the jaw contact portion for engagement with the base wall to non-movably support the jaw contact portion relative to the base; and receiver members carried on the base wall adjacent the aperture on the base wall for receiving opposed side edges of the blade terminal portion of the jaw blade in non-movable engagement.

32. The socket adapter of claim 31 wherein the tab projecting angularly from the blade terminal portion fixedly seats between each pair of mounting members.

33. A watthour meter socket adapter for releasably interconnecting blade terminals of a watthour meter into jaw contacts in a watthour meter socket, the socket adapter comprising:

a housing having a single base wall and an annular side wall unitarily formed with the base and extending from the base;

a plurality of apertures formed in the base wall for receiving individual jaw blades therethrough;

at least one jaw blade mounted in one of the apertures, the at least one jaw blade including:

a jaw contact portion disposed within the housing and a blade terminal portion extending through the aperture in the base wall for insertion into a jaw contact of a watthour meter socket;

a spring clip engaged with the jaw contact portion to form a blade terminal jaw;

a tab projecting angularly from the jaw contact portion for engagement with the base wall to non-movably support the jaw contact portion relative to the base; and means for non-movably supporting the jaw blade in the aperture in the base wall, the supporting means comprising:

at least one pair of projections formed on the base wall and projecting into the aperture, the projections engagable with spaced surfaces on the blade terminal portion for non-movably supporting the blade terminal portion relative to the base wall.

34. A watthour meter socket adapter for releasably interconnecting blade terminals of a watthour meter into jaw contacts in a watthour meter socket, the socket adapter comprising:

a housing having a single base wall and an annular side wall unitarily formed with the base and extending from the base;

a plurality of apertures formed in the base wall for receiving individual jaw blades therethrough;

at least one jaw blade mounted in one of the apertures the at least one jaw blade including:

a jaw contact portion disposed within the housing and a blade terminal portion extending through the aperture in the base wall for insertion into a jaw contact of a watthour meter socket;

a spring clip engaged with the jaw contact portion to form a blade terminal jaw;

a tab projecting angularly from the jaw contact portion for engagement with the base wall to non-movably support the jaw contact portion relative to the base;

means for non-movably supporting the jaw blade in the aperture in the base wall, the supporting means including:

at least one pair of projections formed on the base wall and projecting into the aperture, the projections engagable with spaced surfaces on the blade terminal portion for non-movably supporting the terminal portion relative to the base wall; and receiver members carried on the base wall adjacent the aperture in the base wall for receiving opposed side edges of the blade terminal portion in non-movable engagement.

35. A watthour meter socket adapter for releasably interconnecting blade terminals of a watthour meter into jaw contacts in a watthour meter socket, the socket adapter comprising:

a housing having a base wall and an annular sidewall extending from the base;

a plurality of apertures formed in the base wall for receiving individual jaw blades therethrough; and at least one jaw blade mounted in one of the apertures, the at least one jaw blade including:

a jaw contact portion disposed within the housing and a blade terminal portion extending through the aperture in the base wall; and a spring clip unitarily formed with the jaw contact portion and having ends spaced from the jaw contact portion to define an opening for receiving a watthour meter blade terminal therebetween.

36. The socket adapter of claim 35 wherein the spring clip comprises:

first and second resilient arms joined to and extending from opposite sides of the jaw contact portion of the jaw blade, each of the first and second arms having an outer end spaced from the jaw portion and defining a blade terminal slot therebetween.

37. The socket adapter of claim 36 wherein the ends of the first and second arms are spaced apart.

38. The socket adapter of claim 36 further comprising:

an aperture formed in each of the first and second arms to provide resiliency to the first and second arms.

39. A watthour meter socket adapter for releasably interconnecting blade terminals of a watthour meter into jaw contacts in a watthour meter socket, the socket adapter comprising:

a housing having a single base wall and an annular sidewall unitarily formed with the base wall and extending from the base wall;

a plurality of apertures formed in the base wall for receiving individual jaw blades therethrough;

at least one jaw blade mounted in one of the apertures, the at least one jaw blade including:

the jaw blade formed of an elongated, one piece unitary member having a jaw contact portion at one end and a blade terminal portion at an opposed end; and the jaw contact portion disposed within the housing and the blade terminal portion extending through the aperture in the base wall;

a spring clip mounted on the jaw contact portion to define an opening for receiving a watthour meter blade terminal therebetween; and at least one side flange unitarily formed with the jaw contact portion and projecting angularly from a plane of the jaw contact portion, the side flange having an end edge enagable with the base wall to substantially prevent movement of the jaw contact portion with respect to the base wall when the jaw blade is mounted in the aperture in the base wall.

40. The socket adapter of claim 39 wherein at least one side flange includes two side flanges, each extending from an opposite side edge of the jaw contact portion, each of the two side flanges having an end edge engagable with the base wall.

* * * * *